(12) United States Patent
Otsuka et al.

(10) Patent No.: US 12,347,808 B2
(45) Date of Patent: Jul. 1, 2025

(54) SEMICONDUCTOR DEVICE

(71) Applicant: KIOXIA CORPORATION, Tokyo (JP)

(72) Inventors: Yasuo Otsuka, Kanagawa (JP);
Nobuhito Suzuya, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 413 days.

(21) Appl. No.: 17/897,091

(22) Filed: Aug. 26, 2022

(65) Prior Publication Data

US 2023/0110997 A1  Apr. 13, 2023

(30) Foreign Application Priority Data

Dec. 10, 2021 (JP) .................... 2021-201023

(51) Int. Cl.
*H01L 25/065* (2023.01)
*H01L 25/00* (2006.01)
*H01L 25/18* (2023.01)

(52) U.S. Cl.
CPC .......... *H01L 25/0652* (2013.01); *H01L 25/18* (2013.01); *H01L 25/50* (2013.01); *H01L 2225/06506* (2013.01); *H01L 2225/06562* (2013.01); *H01L 2225/06586* (2013.01)

(58) Field of Classification Search
CPC ............................................ H01L 2225/06562
See application file for complete search history.

(56) References Cited

U.S. PATENT DOCUMENTS

| 7,683,491 B2 * | 3/2010 | Itoh | H01L 23/50 |
| | | | 257/691 |
| 2009/0096075 A1 * | 4/2009 | Joh | H01L 25/0657 |
| | | | 438/109 |
| 2016/0276312 A1 * | 9/2016 | Shimizu | H01L 24/32 |
| 2018/0277529 A1 | 9/2018 | Matsumoto | |
| 2021/0167041 A1 | 6/2021 | Yoshihara et al. | |

FOREIGN PATENT DOCUMENTS

| JP | 2000267756 A | 9/2000 |
| JP | 2004158536 A | 6/2004 |
| JP | 2007200948 A | 8/2007 |
| JP | 2011049412 A | 3/2011 |

* cited by examiner

*Primary Examiner* — Yu-Hsi D Sun
(74) *Attorney, Agent, or Firm* — Kim & Stewart LLP

(57) ABSTRACT

According to one embodiment, a semiconductor device includes a substrate, a chip stack with a plurality of first semiconductor chips, a first wire group, a second wire, and a third wire. The substrate has a first surface with a first pad and a second pad. Each first semiconductor chip has a surface facing away from the first surface with a third pad and a fourth pad. The first wire group includes a plurality of first wires that each electrically connect the first pad to a third pad one of the first semiconductor chips. The second wire electrically connects the second pad to the fourth pad of the first semiconductor chip in the chip stack closest to the substrate. The third wire electrically connects the fourth pads of each of first semiconductor chips.

13 Claims, 24 Drawing Sheets

FIG. 17
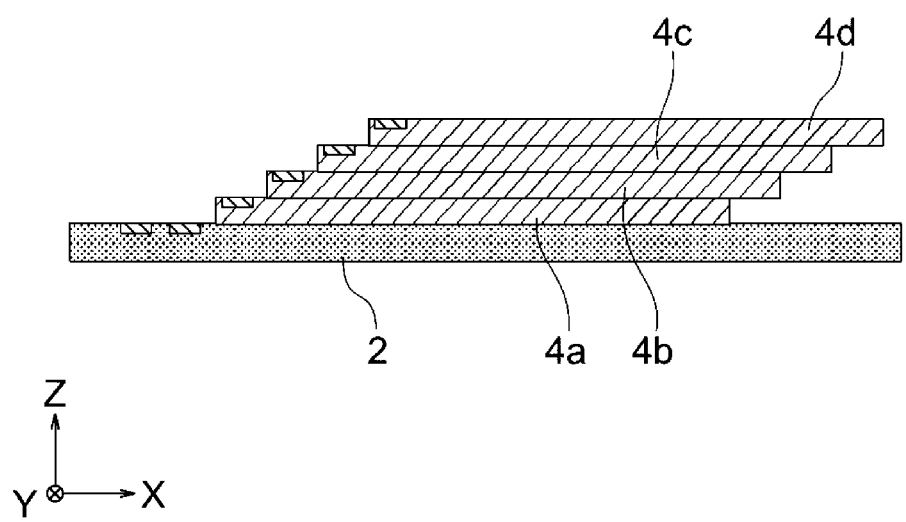
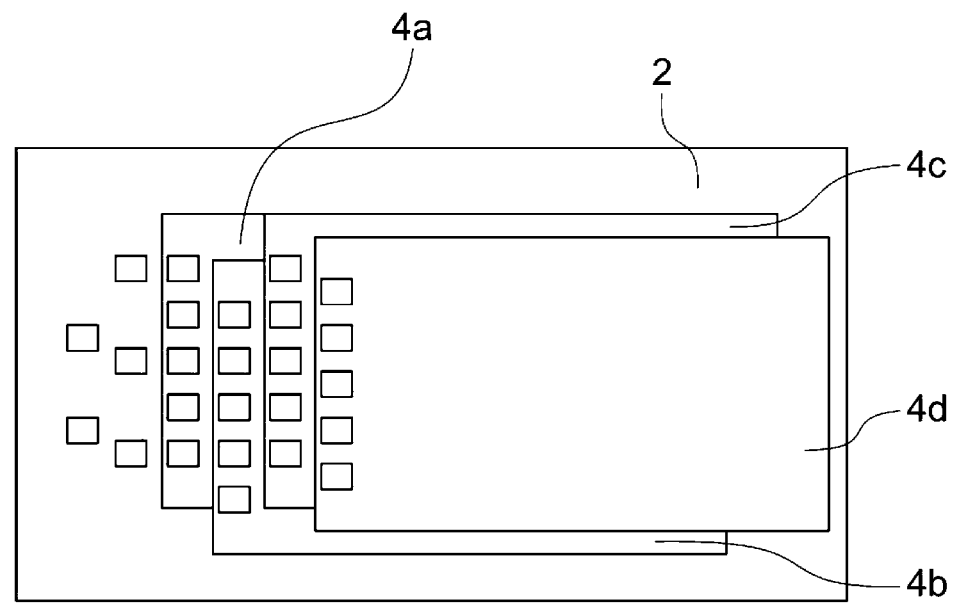
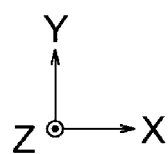

FIG. 18
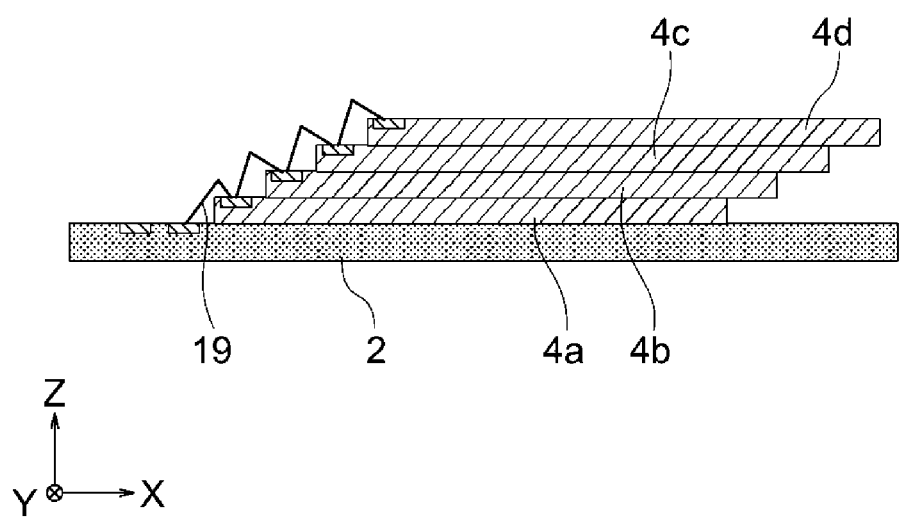
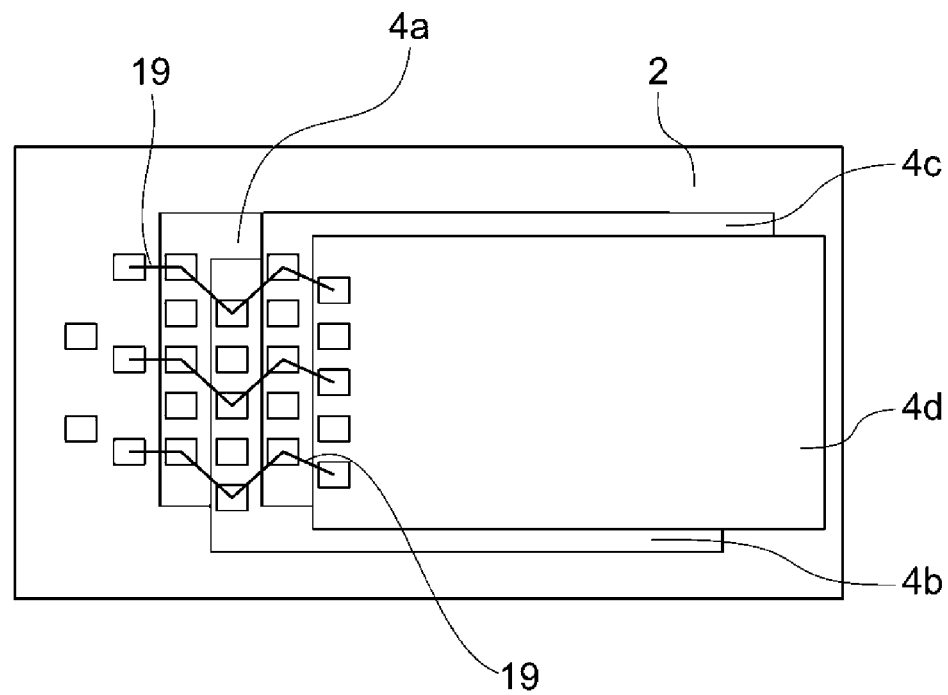

FIG. 19
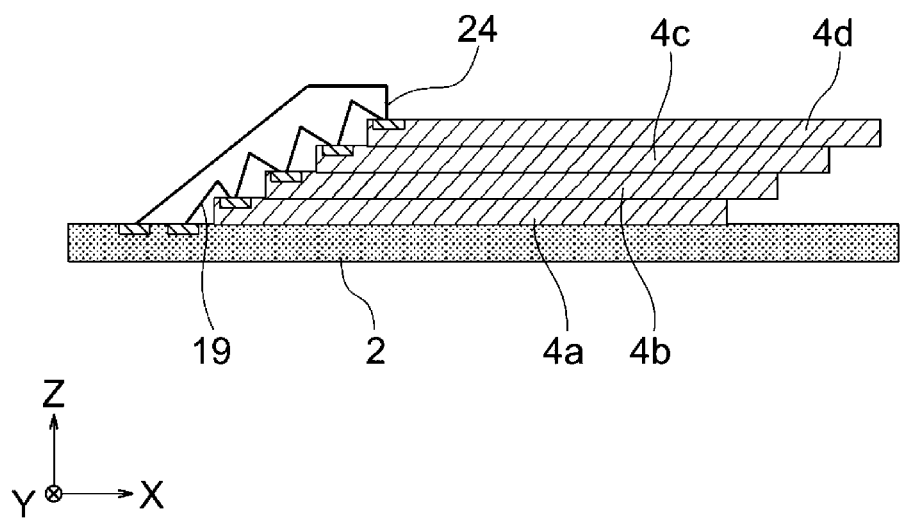
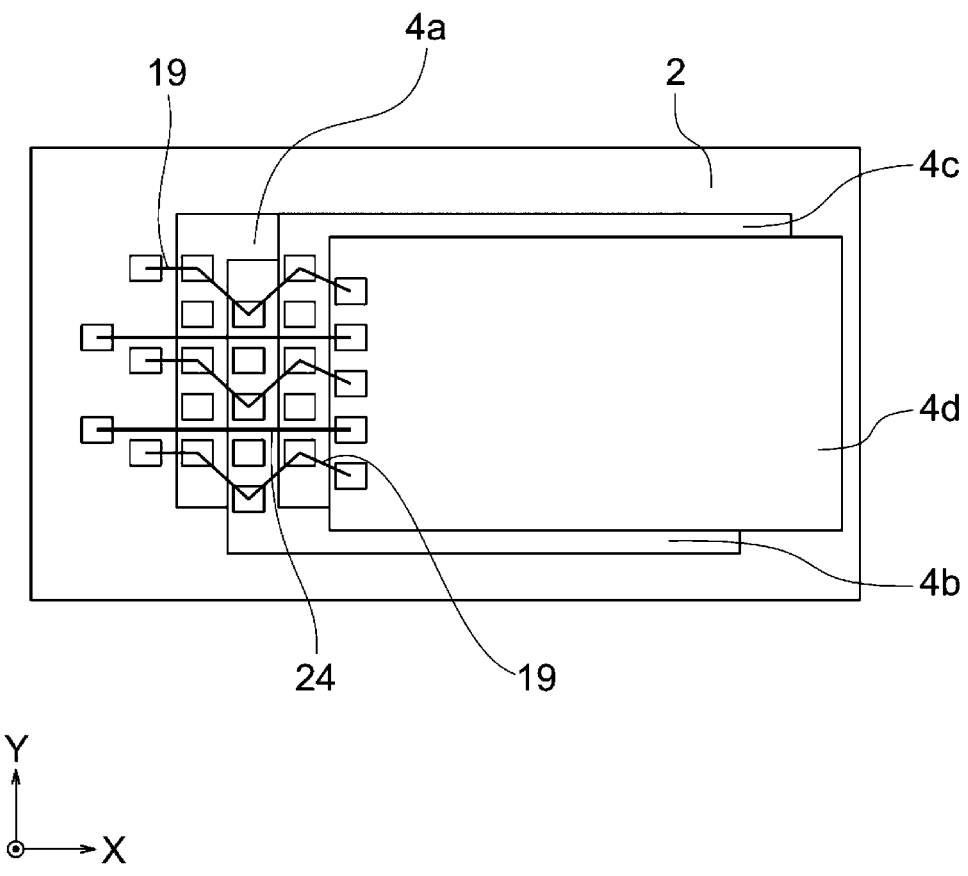

FIG. 20
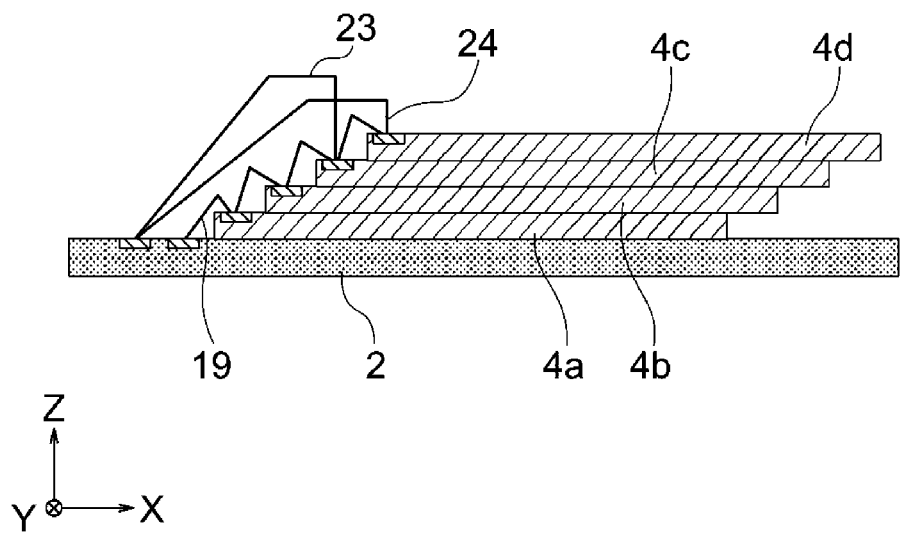
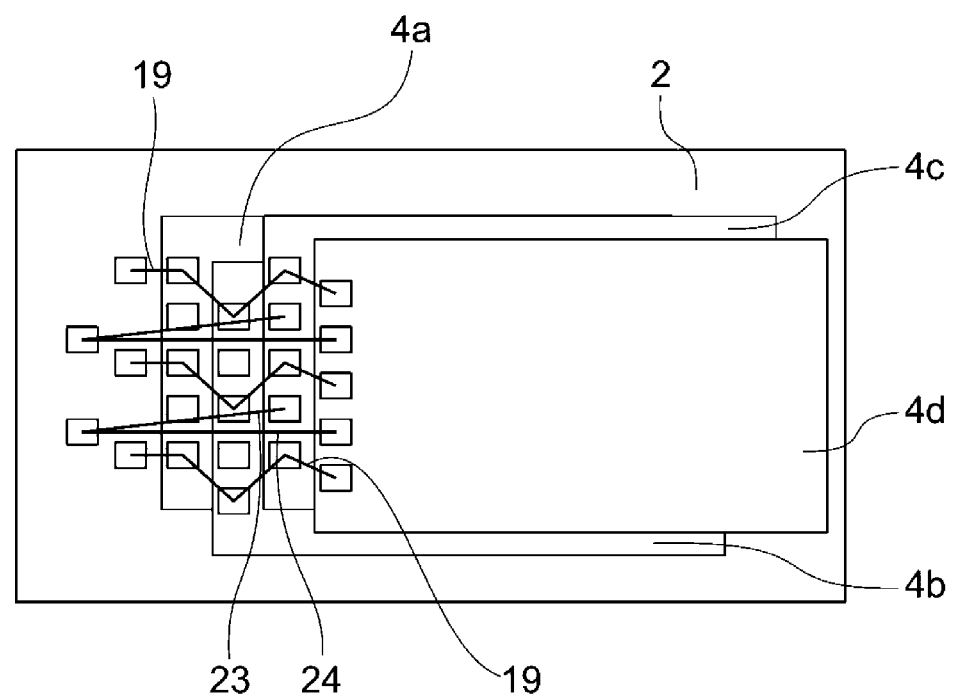

FIG. 21
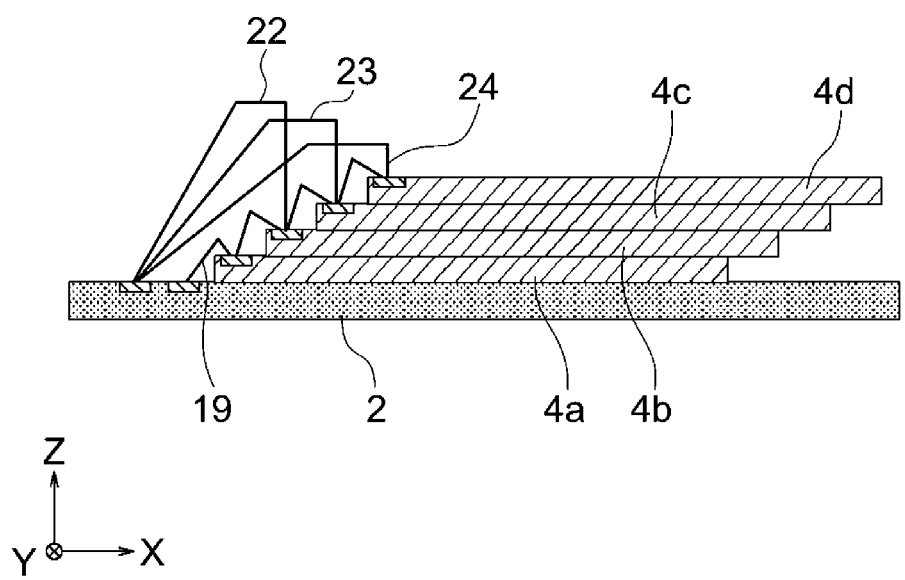
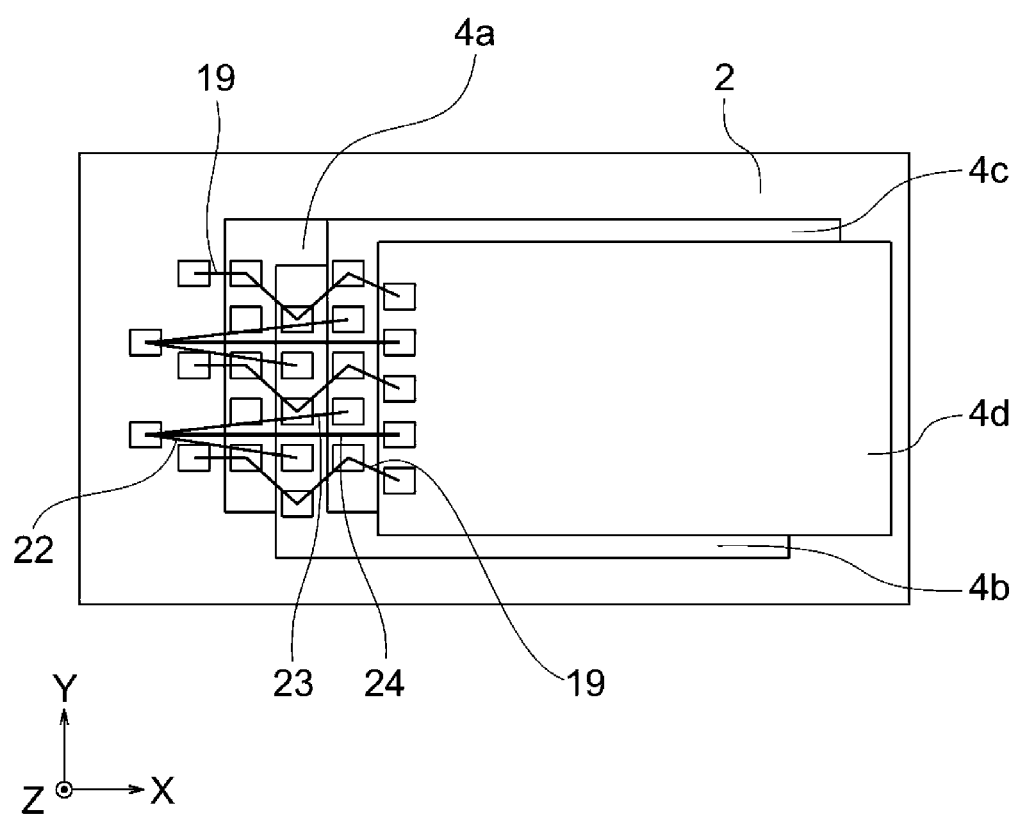

FIG. 22
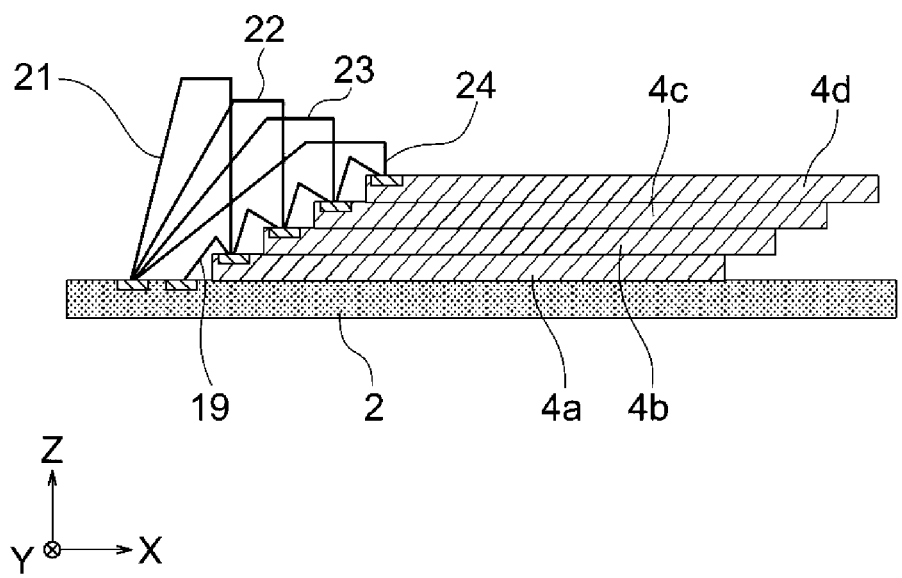
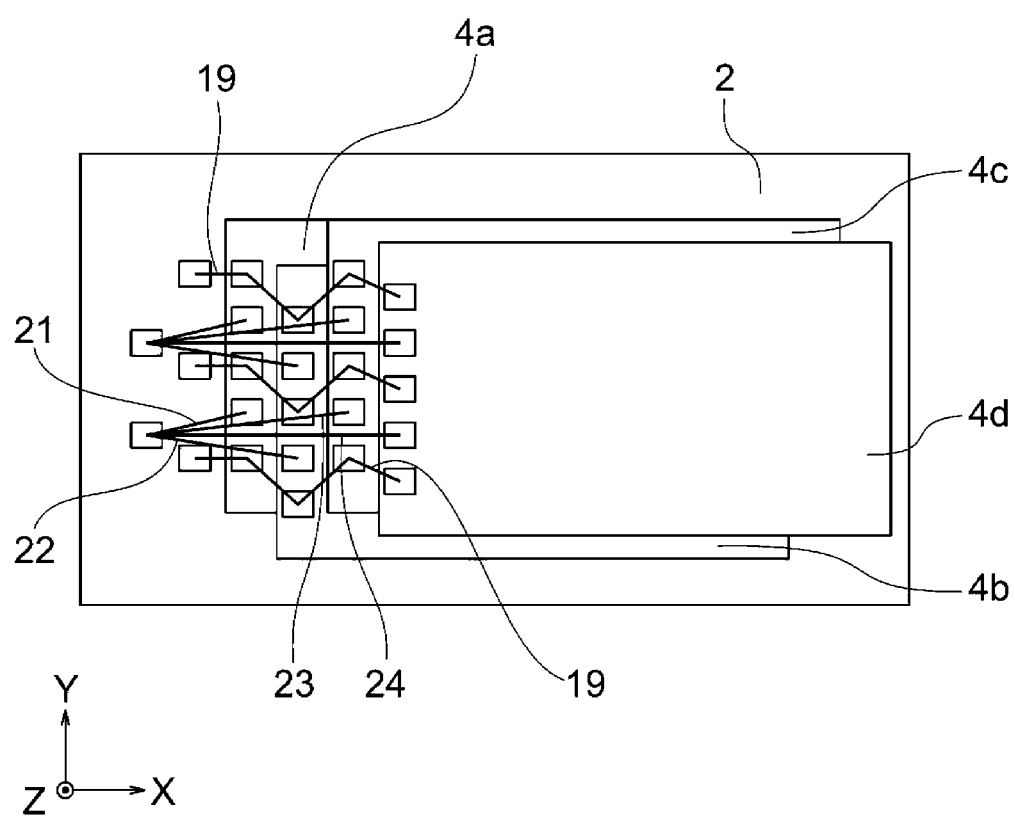

SEMICONDUCTOR DEVICE

CROSS-REFERENCE TO RELATED APPLICATION(S)

This application is based upon and claims the benefit of priority from Japanese Patent Application No. 2021-201023, filed Dec. 10, 2021, the entire contents of which are incorporated herein by reference.

FIELD

Embodiments described herein relate generally to a semiconductor device.

BACKGROUND

A semiconductor device of one type may have a wiring substrate with a semiconductor controller chip and a plurality of stacked semiconductor memory chips. A signal is transmitted by a wire electrically connected between a signal electrode pad on the semiconductor controller chip and a signal electrode pad of a semiconductor memory chip. In a semiconductor device, the signal transmitted between a semiconductor controller chip and a semiconductor memory chip is desired to have high waveform quality.

BRIEF DESCRIPTION OF THE DRAWINGS

FIGS. 17 to 22 depict aspects related to a method of manufacturing a semiconductor device according to a third embodiment.

DETAILED DESCRIPTION

Figure 1:
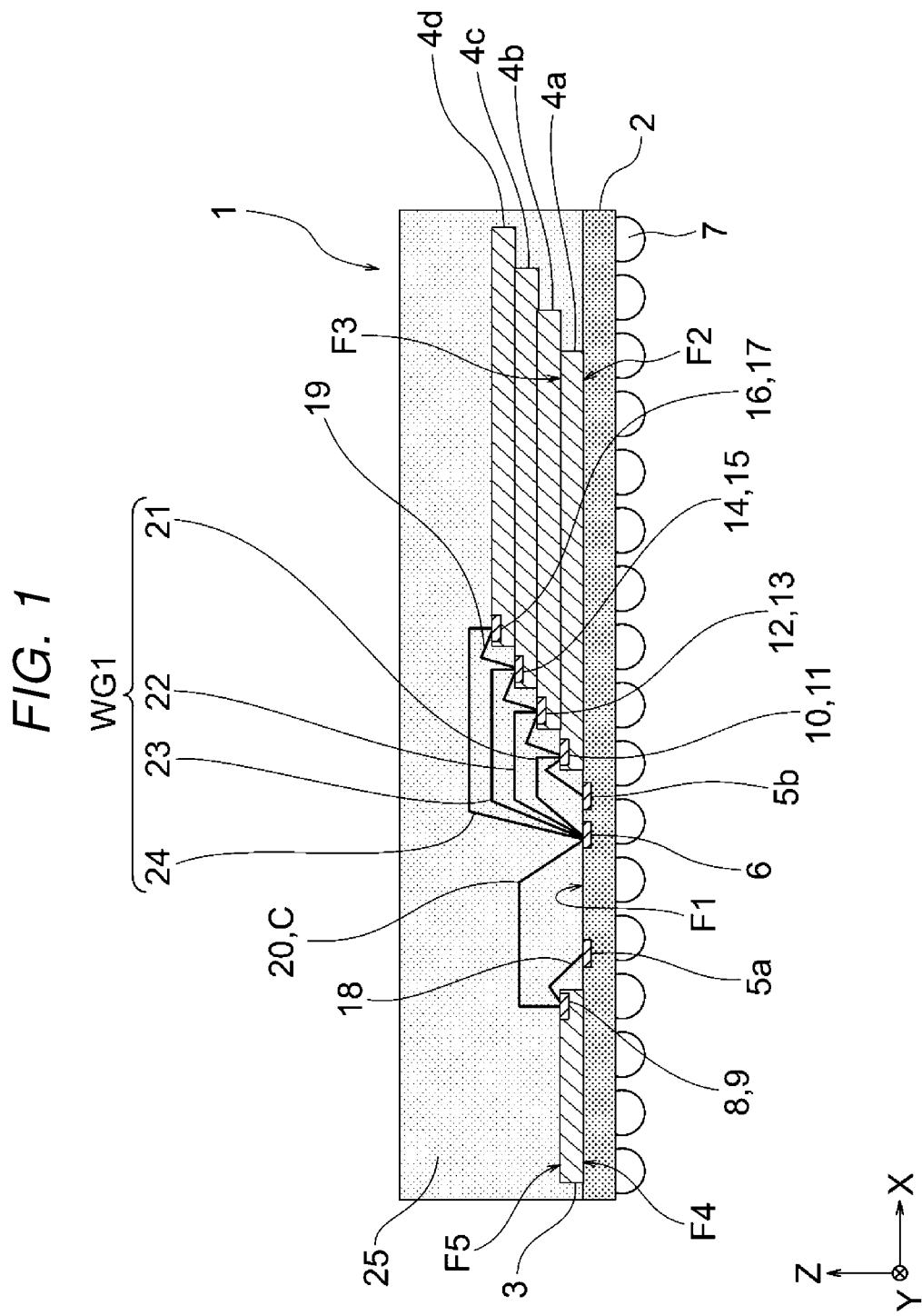
FIG. 1 is a cross-sectional view showing an example of the configuration of a semiconductor device according to a first embodiment.

Embodiments provide a semiconductor device that can have better (less degraded) signal quality.

In general, according to one embodiment, a semiconductor device includes a substrate having a first surface, a first pad, and a second pad. The first and second pads are on the first surface. A chip stack is also on the first surface of the substrate and includes a plurality of first semiconductor chips, each having a third pad and a fourth pad on a surface facing away from the first surface. A first wire group includes a plurality of first wires. Each first wire of the group electrically connects the first pad to a third pad of one of the first semiconductor chips. A second wire electrically connects the second pad to and the fourth pad of the one of the first semiconductor chips in the chip stack closest to the substrate. A third wire electrically connects each fourth pad of the plurality of first semiconductor chips.

Hereinafter, certain example embodiments according to the present disclosure will be described with reference to the drawings. The present disclosure is not limited to these example embodiment.

In the following, the vertical direction (may be referred to as upward or downward directions or the like) refers to a direction orthogonal to a surface of a wiring substrate or the like on which a semiconductor chip can be mounted. The surface of the wiring substrate on which such a semiconductor chip is mounted may be referred to as an upper surface, an upward facing surface, or the like. Various components may be described relative other components as being lower or higher than another based on differences in distances along the vertical direction from the wiring substrate. The vertical direction, as described, may be different from that corresponding to gravitational acceleration.

The drawings are schematic or conceptual and are provided explain particular concepts of the present disclosure. In general, the depicted dimensions, relative dimensions within a drawing, or scaling between different drawings, and the like are not necessarily the same as in an actual implementation of an embodiment.

In the drawings, the elements or aspects that are the same (or substantially so) are provided with the same reference symbols. Such elements or aspects once described in conjunction with a drawing or particular embodiment will not necessarily be described again in conjunction with subsequent drawings and/or embodiments even if such elements or aspects are in the subsequent drawings and/or embodiments.

First Embodiment

FIG. 1 is a cross-sectional view showing an example of the configuration of a semiconductor device 1 according to a first embodiment. The semiconductor device 1 includes a wiring substrate 2, a semiconductor chip 3 (semiconductor controller chip 3), semiconductor chips 4a to 4d (semiconductor memory chips 4a, 4b, 4c, 4d), wires 18 to 24, an insulating sealant 25, and an external connection terminal 7.

The wiring substrate 2 is, for example, a substrate such as a printed circuit board. The wiring substrate 2 can be connected to the semiconductor controller chip 3 and the semiconductor memory chips 4a to 4d via the wires 18 to 24. The wiring substrate 2 includes a wiring layer therein and/or thereon.

The semiconductor controller chip 3 and the semiconductor memory chips 4a to 4d can be provided above the surface F1 of the wiring substrate 2 on an adhesive layer or the like. The adhesive layer is, for example, a film-like resin (DAF, Die Attach Film).

The semiconductor memory chips 4a to 4d are, for example, NAND chips. The semiconductor memory chips 4a to 4d include, for example, a semiconductor element. The semiconductor element is, for example, a memory cell array or a CMOS (Complementary Metal Oxide Semiconductor) circuit. The semiconductor memory chips 4a to 4d are adhered to the wiring substrate 2 and the other semiconductor memory chips 4a to 4d by an adhesive layer. The adhesive layer is, for example, a film-like resin (a resin film). In the example shown in FIG. 1, the semiconductor memory chips 4a to 4d are stacked the vertical direction via an adhesive layer between each adjacent pair. The vertical direction is substantially perpendicular to the substrate upper surface F1 of the wiring substrate 2. Each of the semiconductor memory chips 4a to 4d stacked in this manner is, for example, a memory chip. In this example, the semiconductor memory chips 4a to 4d each have the same configuration as one another. The number of stacked semiconductor memory chips 4a to 4d is not limited to four but may be changed to any number. The number of stacked semiconductor memory chips 4a to 4d is set according to the required memory capacity. As shown in FIG. 1, the semiconductor memory chips 4a to 4d are stacked to be stair-shifted (offset from one another in a direction perpendicular to the vertical direction) rather than fully aligned with one another along the vertical direction. In this manner, it is possible to prevent the other semiconductor memory chips 4a to 4d from overlapping on the electrode pads 10 to 17 of the semiconductor memory chips 4a to 4d, and so the wires 19, 21 to 24 can be connected to the electrode pads 10 to 17 of the semiconductor memory chips 4a to 4d.

The semiconductor controller chip 3 includes, for example, a CMOS circuit. The semiconductor controller chip 3 is electrically connected to the semiconductor memory chips 4a to 4d to control the operation of the semiconductor memory chips 4a to 4d. As shown in FIG. 1, the semiconductor controller chip 3 is provided adjacent to the semiconductor memory chips 4a to 4d rather than stacked thereon or therewith. the semiconductor controller chip 3 is adhered to the wiring substrate 2 by an adhesive layer. The adhesive layer is, for example, a film-like resin. In other examples, the semiconductor controller chip 3 may be provided above the semiconductor memory chips 4a to 4d, for example.

The wires 18 and 20 electrically connect the wiring substrate 2 and the semiconductor controller chip 3. The material of the wires 18 and 20 is a conductive metal such as gold, silver, or copper.

The wires 19, 21 to 24 electrically connect the wiring substrate 2 and the semiconductor memory chips 4a to 4d. The material of the wires 19, 21 to 24 is a conductive metal such as gold, silver, or copper.

The insulating sealant 25 is, for example, a resin such as an epoxy resin. The insulating sealant 25 seals the semiconductor controller chip 3, the semiconductor memory chips 4a to 4d, and the wires 18 to 24 on the upper surface of the wiring substrate 2. Thereby, the insulating sealant 25 protects the semiconductor controller chip 3, the semiconductor memory chips 4a to 4d, and the wires 18 to 24 from impacts from the outside and the outside air.

The external connection terminal 7 is, for example, a metal bump such as a solder ball. In this example, the semiconductor device 1 has a BGA (Ball Grid Array) package structure. The external connection terminal 7 electrically connects the semiconductor device 1 to an external mounting board or the like. The material of the external connection terminal 7 is a conductive metal such as solder. The external connection terminal 7 is provided on the lower surface of the wiring substrate 2. That is, the external connection terminal 7 is provided on the surface of the wiring substrate 2 opposite to the surface F1 on which the semiconductor controller chip 3 and the semiconductor memory chips 4a to 4d are provided.

The wiring substrate 2 has a surface F1 and electrode pads 5a, 5b, and 6. The electrode pads 5a, 5b, and 6 are provided on the surface F1.

The semiconductor controller chip 3 has a surface F4, a surface F5, and electrode pads 8 and 9. The surface F4 is a surface facing the surface F1 of the wiring substrate 2. The surface F5 is a surface opposite to the surface F4. The electrode pads 8 and 9 are provided on the surface F5.

The semiconductor memory chip 4a has a surface F2, a surface F3, and electrode pads 10 and 11. The semiconductor memory chip 4b has a surface F2, a surface F3, and electrode pads 12 and 13. The semiconductor memory chip 4c has a surface F2, a surface F3, and electrode pads 14 and 15. The semiconductor memory chip 4d has a surface F2, a surface F3, and electrode pads 16 and 17. The surface F2 is a surface facing the surface F1 of the wiring substrate 2. The surface F3 is the surface opposite to the surface F2. The electrode pads 10 to 17 are provided on the surface F3 of the corresponding semiconductor memory chips 4a to 4d.

Next, the details of the arrangement of the electrode pads 5a, 5b, 6, 8 to 17 and the wires 18 to 24 will be described.

Figure 2:
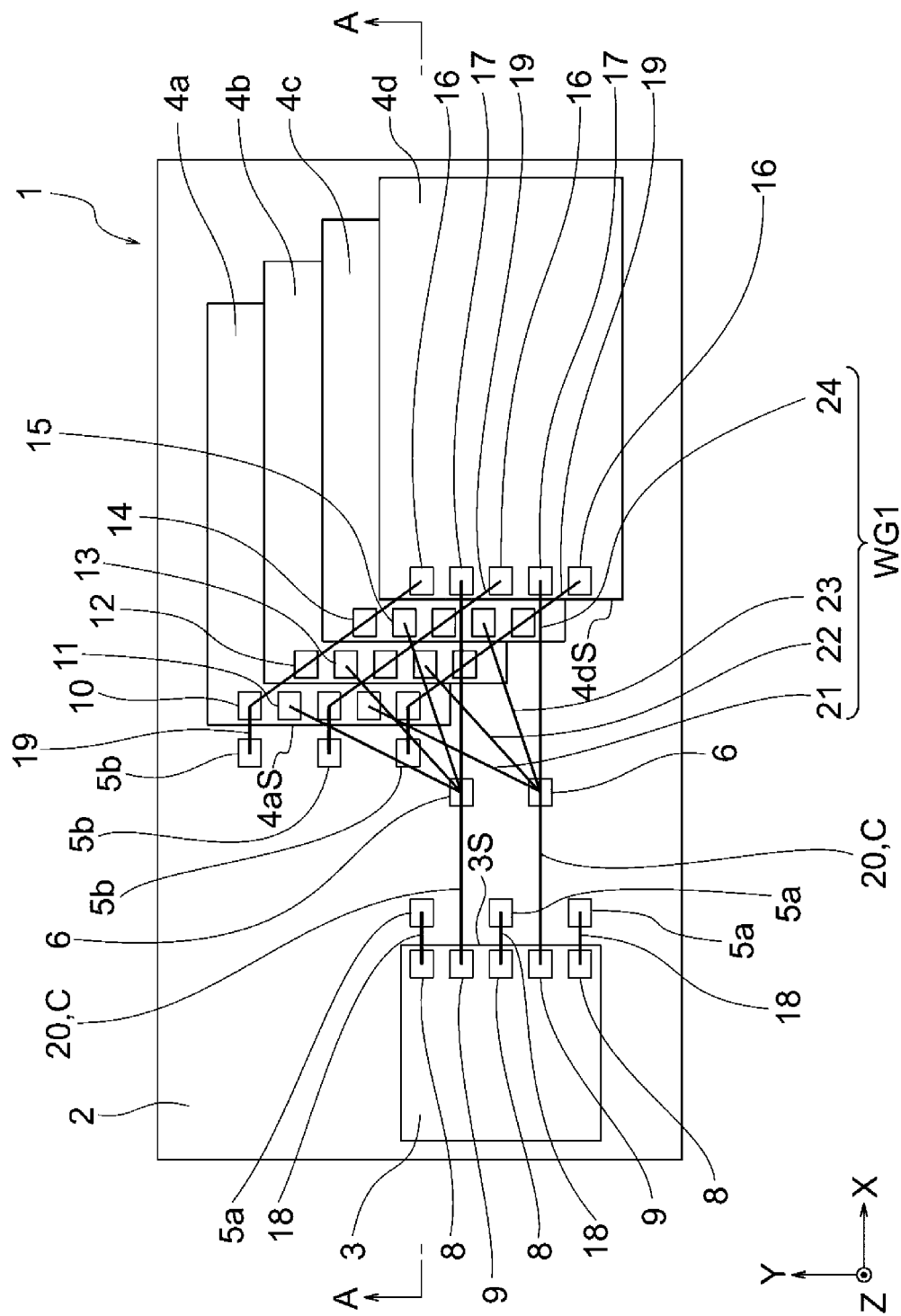
FIG. 2 is a plan view showing an example of the configuration of a semiconductor device according to a first embodiment.

FIG. 2 is a plan view showing an example of the configuration of the semiconductor device 1 according to the first embodiment. Line A-A of FIG. 2 shows a cross section position corresponding to FIG. 1. In FIG. 1, the wires 18 to 24 are also shown in side view.

The electrode pads 5a and 5b are, for example, electrode pads for supplying power or ground voltage. The electrode pads 5a are located on the surface F1 near the semiconductor controller chip 3. The electrode pads 5b are located on the surface F1 near the semiconductor memory chips 4a to 4d.

The electrode pad 6 is, for example, an electrode pad for signal transmission. The electrode pads 6 are located between the semiconductor controller chip 3 and the semiconductor memory chips 4a to 4d on the surface F1.

The outer edge shape (outer perimeter) of the semiconductor controller chip 3, as seen from an orthogonal direction of the wiring substrate 2, is substantially rectangular.

The electrode pad 8 is, for example, an electrode pad for supplying a reference voltage for power supply or ground. The electrode pad 9 is, for example, an electrode pad for signal transmission. The electrode pads 8 and 9 are located alternately on the surface F5 along one side (side 3S) of the semiconductor controller chip 3.

The outer edge shape (outer perimeter) of each of the semiconductor memory chips 4a to 4d, as seen from an orthogonal direction of the wiring substrate 2, would appear substantially rectangular absent the presence of the other ones of the stacked semiconductor memory chips 4a to 4d.

The semiconductor memory chips 4a to 4d are stacked to form what may be called "a chip stack". The semiconductor memory chips 4a to 4d are stacked offset from one another in the X direction. As a result, the electrode pads 10 to 17 are left exposed from above, and can be connected to the wires 19, 21 to 24. The semiconductor memory chips 4a to 4d are also offset from one another in the Y direction. This is to facilitate a direct connection of each of the semiconductor memory chips 4a to 4d to the electrode pads 6, as will be described later. "Direct connection" in this context, means that each of the semiconductor memory chips 4a to 4d are electrically connected to the electrode pads 6 of the wiring substrate 2 without the connection going through any of the other semiconductor memory chips 4a to 4d.

The plurality of semiconductor memory chips 4a to 4d are stacked to be displaced from the respective sides 4aS to 4dS of the semiconductor memory chips 4a to 4d toward the side opposite to the sides 4aS to 4dS in the X direction (first direction). The plurality of semiconductor memory chips 4a to 4d are also stacked to be displaced in the Y direction (second direction) perpendicular to the X direction and the Z direction (stacking direction). In the example shown in FIG. 2, the plurality of semiconductor memory chips 4a to 4d are stacked to be displaced in the −Y direction from the bottom to the top.

The electrode pad 10 is, for example, an electrode pad for supplying a reference voltage for power supply or ground. The electrode pad 11 is, for example, an electrode pad for signal transmission. The electrode pads 10 and 11 are located alternately on the surface F3 along one side (side 4aS) of the semiconductor memory chip 4a. The various electrode pads on semiconductor memory chip 4a (e.g., the five depicted in FIG. 2) may be located in an order such as an electrode pad for power supply, an electrode pad for signal, an electrode pad for ground, another electrode pad for signal, and another electrode pad for power supply.

The electrode pad 12 is, for example, an electrode pad for supplying a reference voltage for power supply or ground. The electrode pad 13 is, for example, an electrode pad for signal transmission. The electrode pads 12 and 13 are located alternately on the surface F3 along one side of the semiconductor memory chip 4b. The various electrode pads on semiconductor memory chip 4b (e.g., the five depicted in FIG. 2) may be located in order such as an electrode pad for power supply, an electrode pad for signal, an electrode pad for ground, an electrode pad for signal, and an electrode pad for power supply.

The electrode pad 14 is, for example, an electrode pad for supplying a reference voltage for power supply or ground. The electrode pad 15 is, for example, an electrode pad for signal transmission. The electrode pads 14 and 15 are located alternately on the surface F3 along one side of the semiconductor memory chip 4c. The various electrode pads on semiconductor memory chip 4c (e.g., the five depicted in FIG. 2) may be located in order such as an electrode pad for power supply, an electrode pad for signal, an electrode pad for ground, an electrode pad for signal, and an electrode pad for power supply.

The electrode pad 16 is, for example, an electrode pad for supplying a reference voltage for power supply or ground. The electrode pad 17 is, for example, an electrode pad for signal transmission. The electrode pads 16 and 17 are located alternately on the surface F3 along one side (side 4dS) of the semiconductor memory chip 4d. The various electrode pads on semiconductor memory chip 4d (e.g., the five depicted in FIG. 2) may be located in order such as an electrode pad for power supply, an electrode pad for signal, an electrode pad for ground, an electrode pad for signal, and an electrode pad for power supply.

The wire 18 is, for example, a wire for supplying a reference voltage for power supply or ground. The wire 18 electrically connects the electrode pad 5a of the wiring substrate 2 and the electrode pad 8 of the semiconductor controller chip 3.

The plurality of wires 19 are, for example, wires for supplying a reference voltage for power supply or ground. Some wires 19 electrically connect the electrode pads 5b of the wiring substrate 2 to the electrode pads 10, 12, 14, and 16. Other wires 19 electrically connect the electrode pads 10, 12, 14, and 16 of adjacent semiconductor memory chips 4a to 4d to one another.

A wire 19 electrically connects the electrode pad 5b and an electrode pad 10 of the semiconductor memory chip 4a. A wire 19 electrically connects an electrode pad 10 of the semiconductor memory chip 4a and an electrode pad 12 of the semiconductor memory chip 4b. A wire 19 electrically connects an electrode pad 12 of the semiconductor memory chip 4b and an electrode pad 14 of the semiconductor memory chip 4c. A wire 19 electrically connects an electrode pad 14 of the semiconductor memory chip 4c and an electrode pad 16 of the semiconductor memory chip 4d.

The wires 19 are provided one step (chip stage) at a time according to the number of semiconductor memory chips 4a to 4d. Therefore, a wire 19 that connects the electrode pads 5b of the wiring substrate 2 to an electrode pad 10, 12, 14, or 16 connects chip-to-chip at each chip stage of the chip stack (see, e.g., FIG. 1). In general, the wire 19 is provided so that the height of the loop (portion between connected pads) is as low in height as possible. As a result, the wiring substrate 2 and the semiconductor memory chips 4a to 4d can be connected so that each wire 19 becomes shorter.

The wire 20 is, for example, a wire for signal transmission. The wire 20 electrically connects the electrode pad 6 of the wiring substrate 2 and the electrode pad 9 of the semiconductor controller chip 3. The wire 20 may also be referred to as a connecting conductor C.

The wire 21 is, for example, a wire for signal transmission. The wire 21 electrically connects the electrode pad 6 of the wiring substrate 2 and the electrode pad 11 of the semiconductor memory chip 4a.

The wire 22 is, for example, a wire for signal transmission. The wire 22 electrically connects the electrode pad 6 of the wiring substrate 2 and the electrode pad 13 of the semiconductor memory chip 4b.

The wire 23 is, for example, a wire for signal transmission. The wire 23 electrically connects the electrode pad 6 of the wiring substrate 2 and the electrode pad 15 of the semiconductor memory chip 4c.

The wire 24 is, for example, a wire for signal transmission. The wire 24 electrically connects the electrode pad 6 of the wiring substrate 2 and the electrode pad 17 of the semiconductor memory chip 4d.

That is, the wires 21 to 24 electrically connect the electrode pads 6 of the wiring substrate 2 and the electrode pads 11, 13, 15, and 17 of the semiconductor memory chips 4a to 4d, respectively.

The wires 21 to 24 may be collectively referred to as a wire group WG1. In the example shown in FIG. 2, the wiring substrate 2 has two electrode pads 6. Furthermore, two wire groups WG1 are provided, one for each electrode pad 6.

The signals transmitted (transmitted and/or received) between each of the semiconductor memory chips 4a to 4c and the semiconductor controller chip 3 pass through the electrode pad 6, one of the electrode pads 11, 13, 15, and 17

(corresponding to individual memory chip), the electrode pad 9, the wires 21 to 24, and the wire 20 (connecting conductor C).

In the example shown in FIG. 2, the semiconductor memory chips 4a to 4d are stacked to be displaced in the Y direction and are each directly connected to the electrode pad 6. In the plan view shown in FIG. 2, the electrode pads 9, 11, 13, 15, and 17 are located at substantially equal intervals with the electrode pad 6 as the center. In the plan view shown in FIG. 2, the wires 20 to 24 are provided with similar lengths (for example, approximately or substantially the same). Thereby, as described with reference to FIG. 3, deterioration of signal quality can be reduced.

Figure 3:
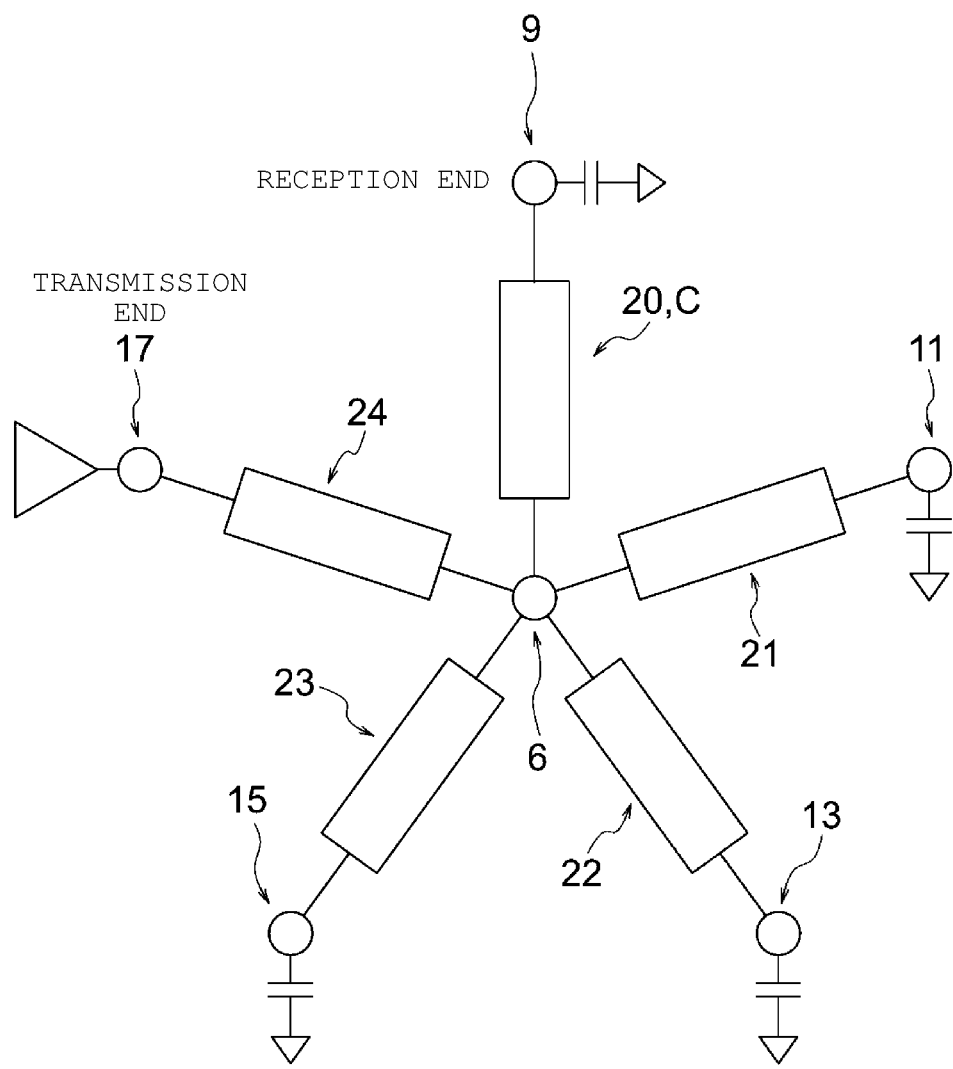
FIG. 3 is a schematic diagram showing a connection relationship between a semiconductor controller chip and a semiconductor memory chip according to a first embodiment.

FIG. 3 is a schematic diagram showing an example of the connection relationship between the semiconductor controller chip 3 and the semiconductor memory chips 4a to 4d according to the first embodiment. FIG. 3 shows an example in which the semiconductor memory chip 4d transmits a signal and the semiconductor controller chip 3 receives the signal. Therefore, the electrode pad 17 of the semiconductor memory chip 4d is the transmission end, and the electrode pad 9 of the semiconductor controller chip 3 is the reception end.

The signal transmitted from the electrode pad 17 is transmitted to the electrode pads 9, 11, 13, and 15 via the electrode pad 6, for example. The signal is reflected, for example, by the electrode pads 9, 11, 13, 15, and 17 (the semiconductor controller chip 3 and the semiconductor memory chips 4a to 4d). The signal waveform of the signal received by the electrode pad 9 (which is the reception end) is formed by synthesis of, for example, a signal incident on the electrode pads 9, 11, 13, 15, and 17 and a signal reflected from the electrode pads 9, 11, 13, 15, and 17.

Here, when the transmission delays (delay times) from the central electrode pad 6 to the electrode pads 9, 11, 13, 15, and 17 are substantially the same, the timing of signal reflection is substantially the same and the effect of reflection can be offset. As a result, it is possible to prevent deterioration of the waveform quality of the signal waveform to be synthesized. As a result, the semiconductor controller chip 3 can receive the signal more appropriately (clearly or without distortion).

The transmission delay is calculated, for example, by the electrical characteristics (signal transmission characteristics) of the wires 20 to 24 and the electrode pads 9, 11, 13, 15, and 17. The signal transmission characteristics of the wires 20 to 24 are determined, for example, by the thickness and length. The signal transmission characteristics of the electrode pads 9, 11, 13, 15, and 17 are determined by, for example, the capacitances thereof.

Therefore, it is preferable that the signal transmission characteristics from the electrode pad 6 to the semiconductor memory chips 4a to 4d and the signal transmission characteristics from the electrode pad 6 to the semiconductor controller chip 3 are substantially the same. That is, the electrode pads 11, 13, 15, and 17, the electrode pad 9, the wire group WG1 (wires 21 to 24), and the wire 20 (connecting conductor C) are provided such that the signal transmission characteristics (delay time) from the electrode pad 6 to the semiconductor memory chips 4a to 4d and the signal transmission characteristics from the electrode pad 6 to the semiconductor controller chip 3 are substantially the same.

When the semiconductor memory chips 4a to 4d are separated from a single wafer, each of the chips are formed by the same process. Therefore, the capacitances of the electrode pads 11, 13, 15, and 17, respectively, of the semiconductor memory chips 4a to 4d are usually substantially the same. However, the capacitance of the electrode pad 9 of the semiconductor controller chip 3 may be different from the capacitances of the electrode pads 11, 13, 15, and 17 of the semiconductor memory chips 4a to 4d.

Each of the wires 20 to 24 is usually formed in the same way, and the thickness of each of the wires 20 to 24 is substantially the same. However, depending on the difference between the capacitance of the electrode pad 9 of the semiconductor controller chip 3 and the capacitances of the electrode pads 11, 13, 15, and 17 of the semiconductor memory chips 4a to 4d, the length of the wire 20 may be set to be different from the length of each of the wires 21 to 24.

The electrode pads 6 for the semiconductor memory chips 4a to 4d, and the signal transmission characteristics of the wires 21 to 24 need to be substantially the same. That is, the variation in the signal transmission characteristics of the wires 21 to 24 is preferably less than or equal to some predetermined value. More specifically, the variation in the signal transmission characteristics of the wires 21 to 24 is preferably 10% or less with respect to an average value.

Preferably, the thickness and length of each of the wires 21 to 24 are, for example, substantially the same. That is, the variation in the thickness and length of each of the wires 21 to 24 is preferably less than or equal to a predetermined value (for example, 10% or less with respect to the average value). Each of the wires 21 to 24 is usually formed in the same method, and the thickness of each of the wires 21 to 24 is thus substantially the same. Therefore, it is preferable that the wires 21 to 24 have substantially the same length.

In FIG. 2, the lengths of the wires 21 to 24 in a plan view are shown to be about the same. However, in FIG. 1, it is shown that the lengths of the wires 21 to 24 can be different depending on the height of the loop. Thus, the lengths of the wires 21 to 24 in the plan view may be different from one another, but the actual lengths of the wires 21 to 24 can still be made substantially the same by, for example, varying the height of the loop for the wires. For example, the maximum height of the loop may be gradually lowered from the wire 24 to the wire 21.

Next, a method of connecting the wires 19 and 21 to 24 to the semiconductor memory chips 4a to 4d will be described.

FIGS. 4 to 9 are diagrams showing an example of a method for manufacturing the semiconductor device 1 according to the first embodiment. The upper part of each of FIGS. 4 to 9 shows a cross-sectional view of the semiconductor memory chips 4a to 4d. The lower part of each of FIGS. 4 to 9 shows a plan view of the semiconductor memory chips 4a to 4d.

Figure 4:
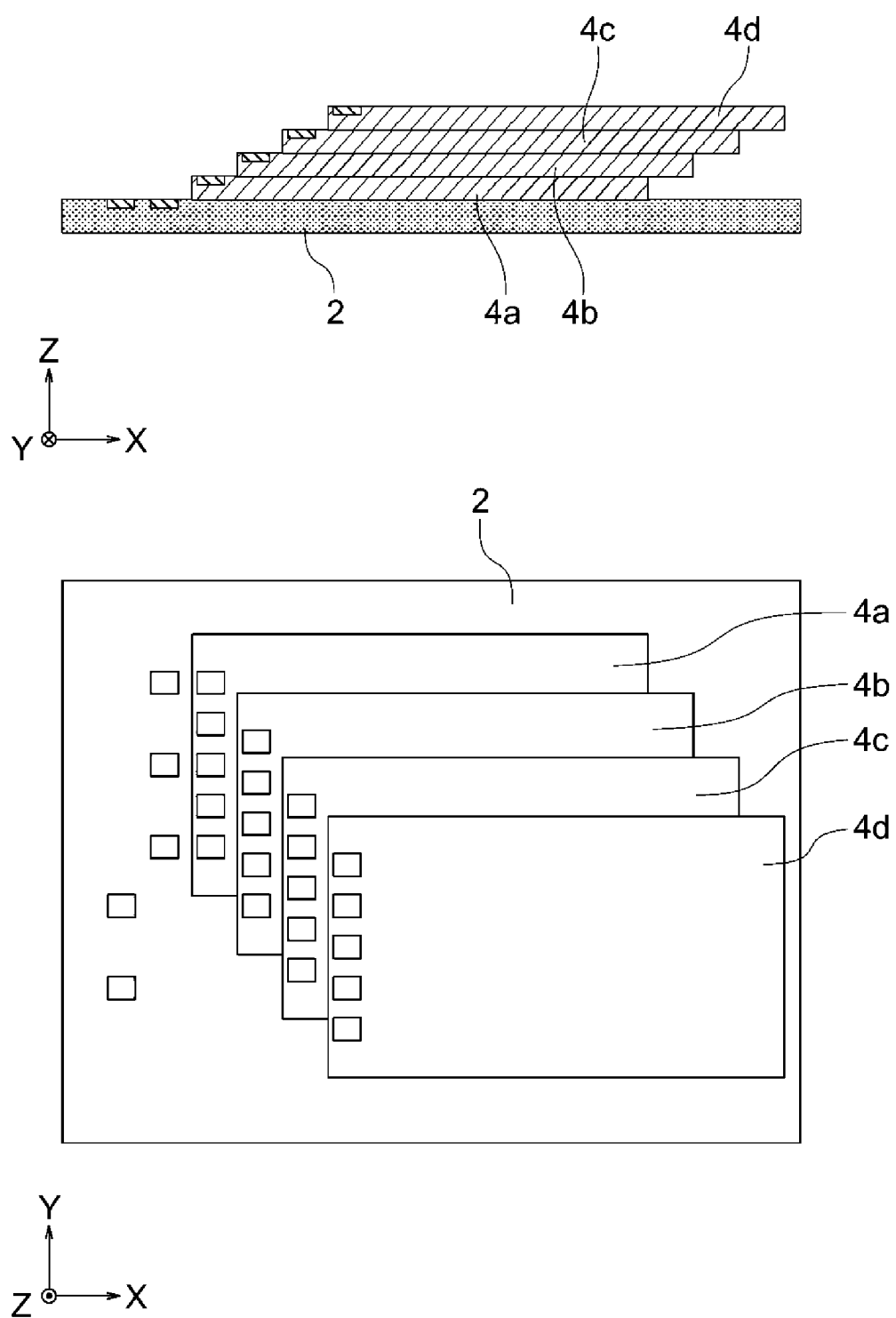
FIGS. 4 to 9 depict aspects related to a method of manufacturing a semiconductor device according to a first embodiment.

First, as shown in FIG. 4, the semiconductor memory chips 4a to 4d are mounted on the wiring substrate 2. The semiconductor memory chips 4a to 4d are stacked to be displaced in the X direction and the Y direction.

Figure 5:
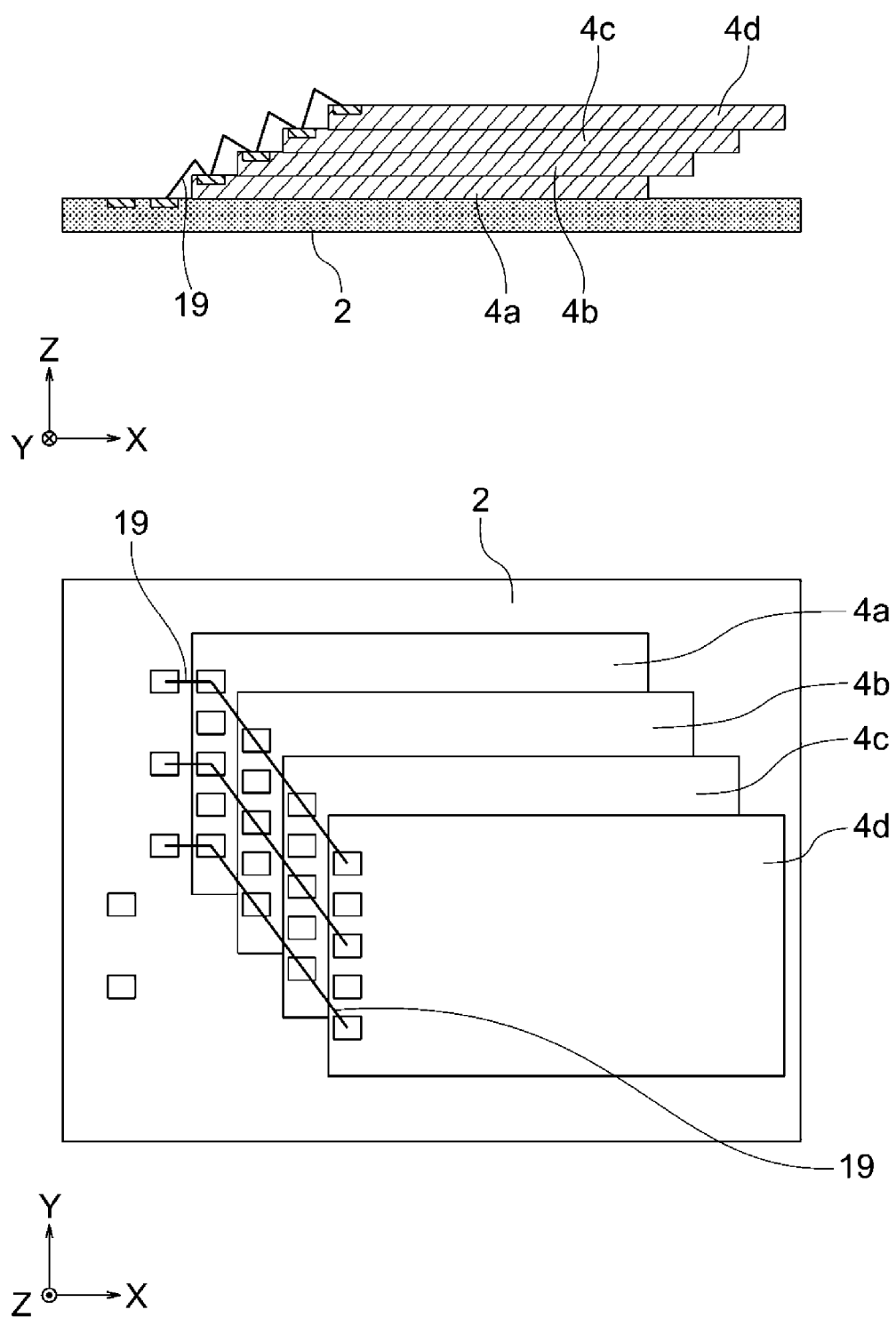
Figure 6:
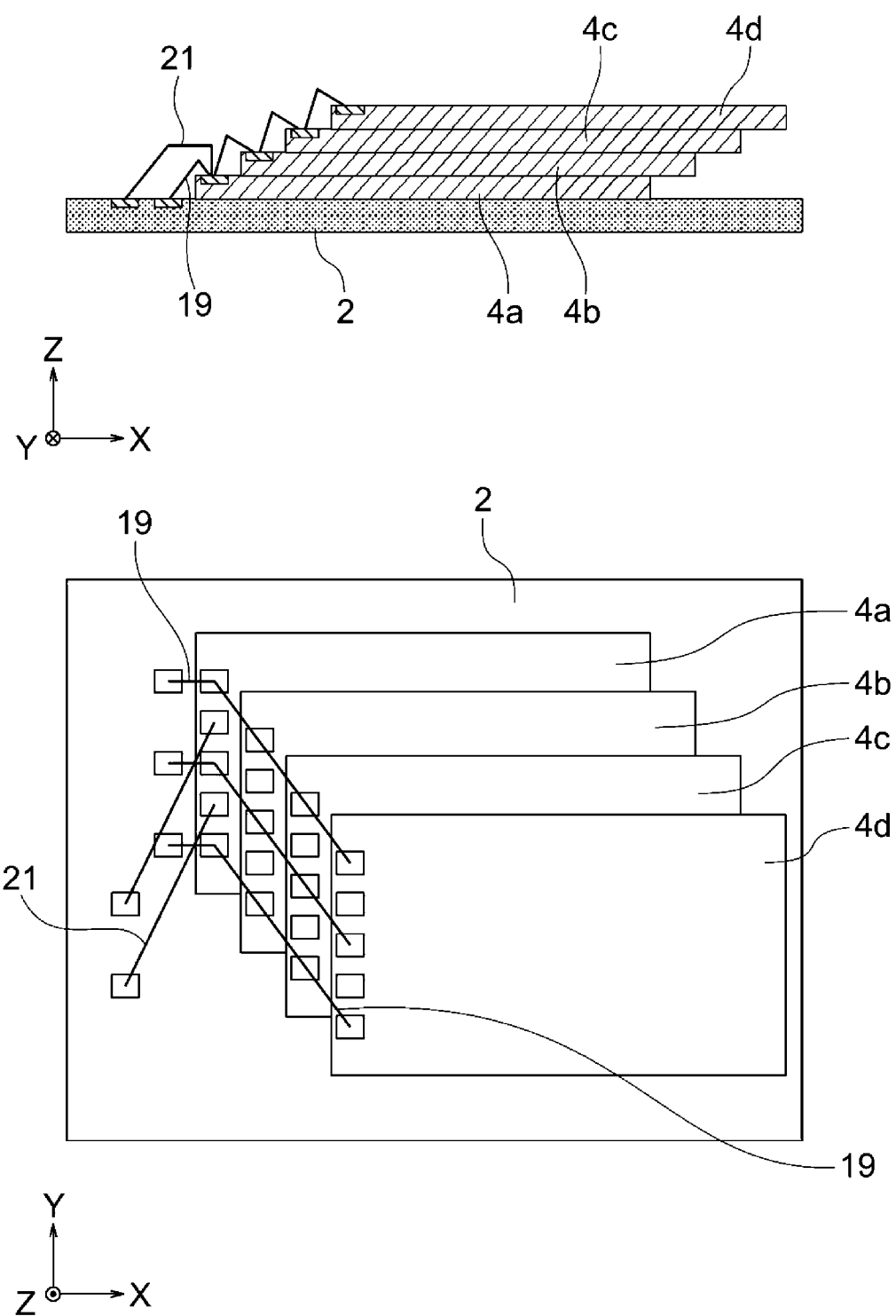
Figure 7:
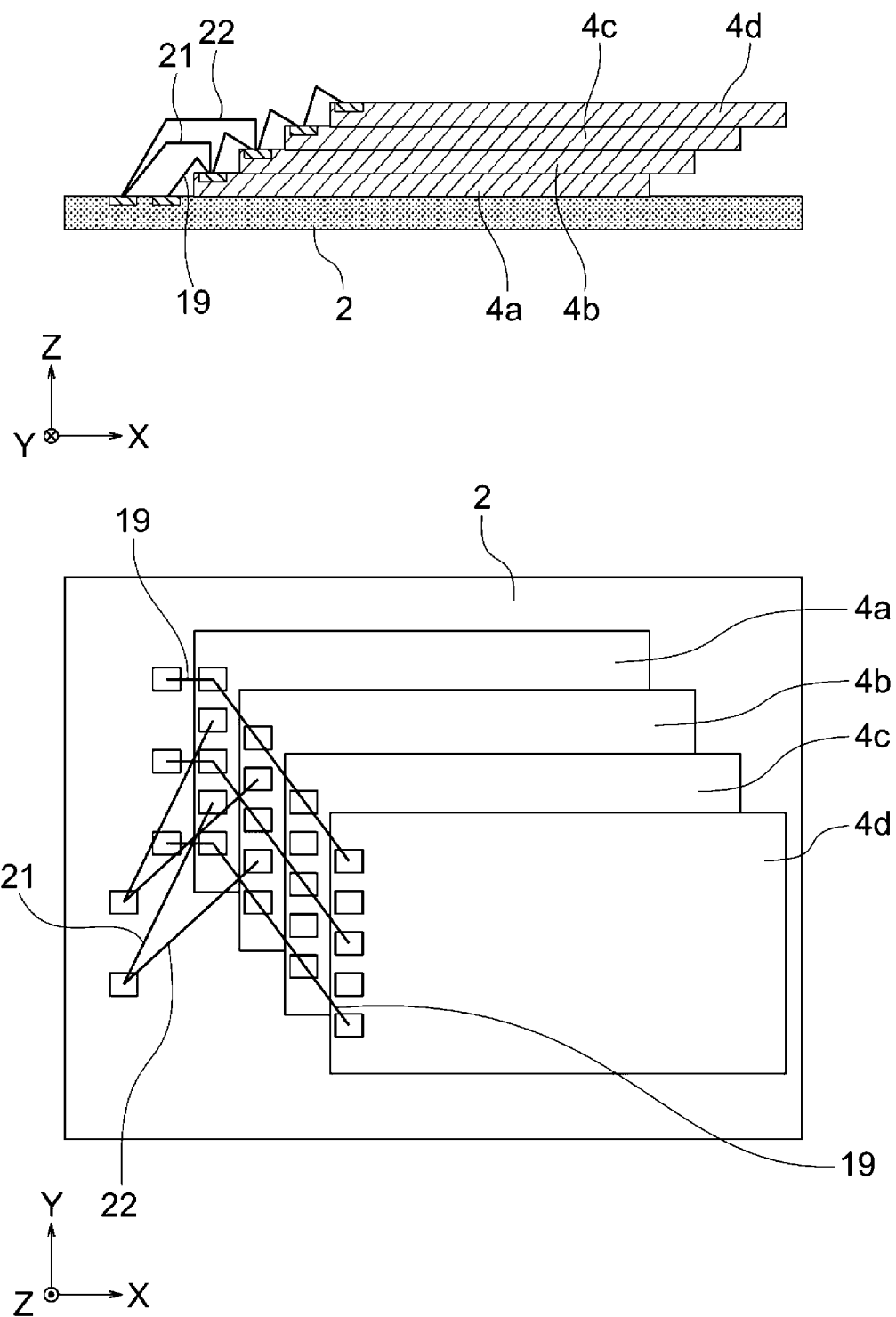
Figure 8:
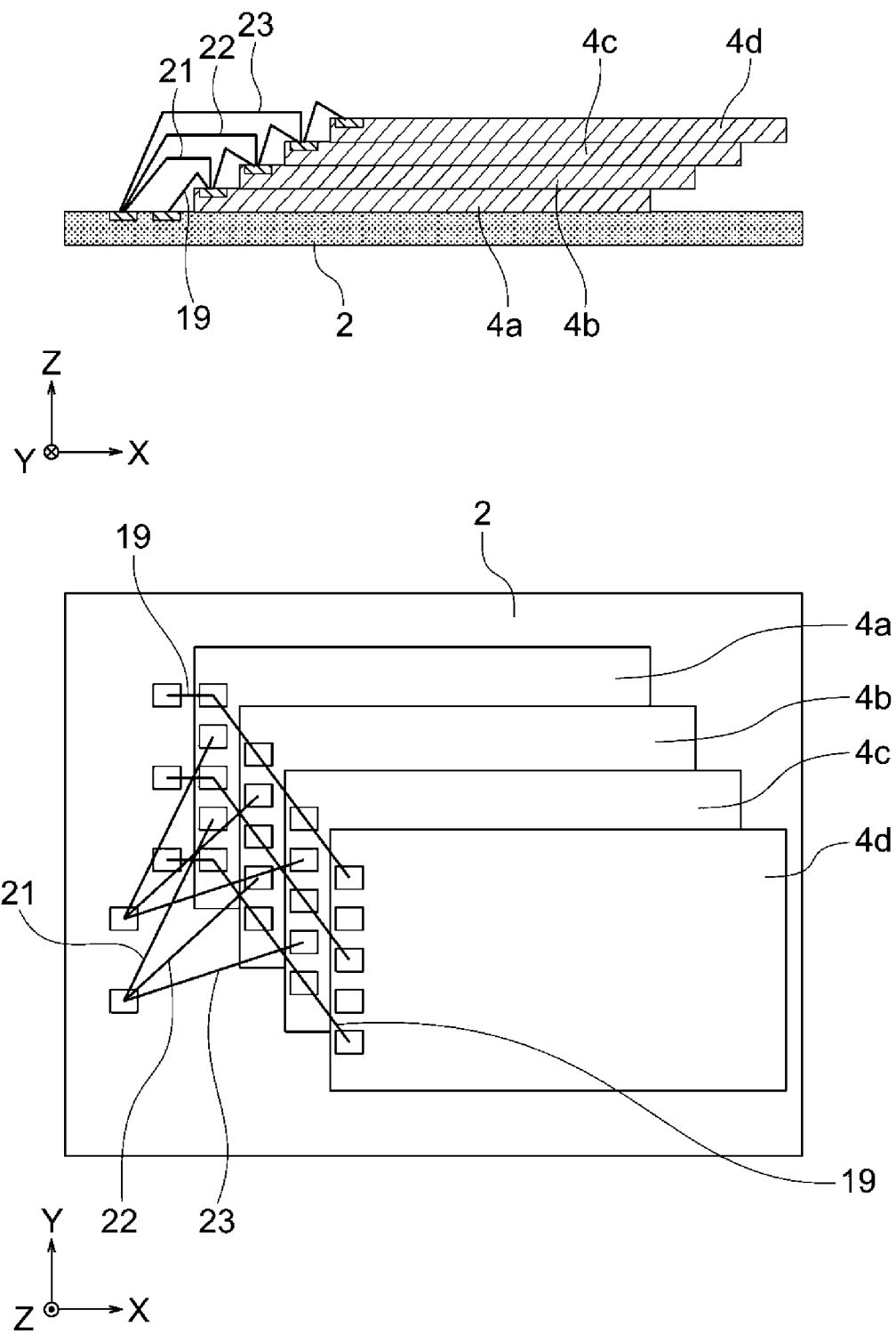
Figure 9:
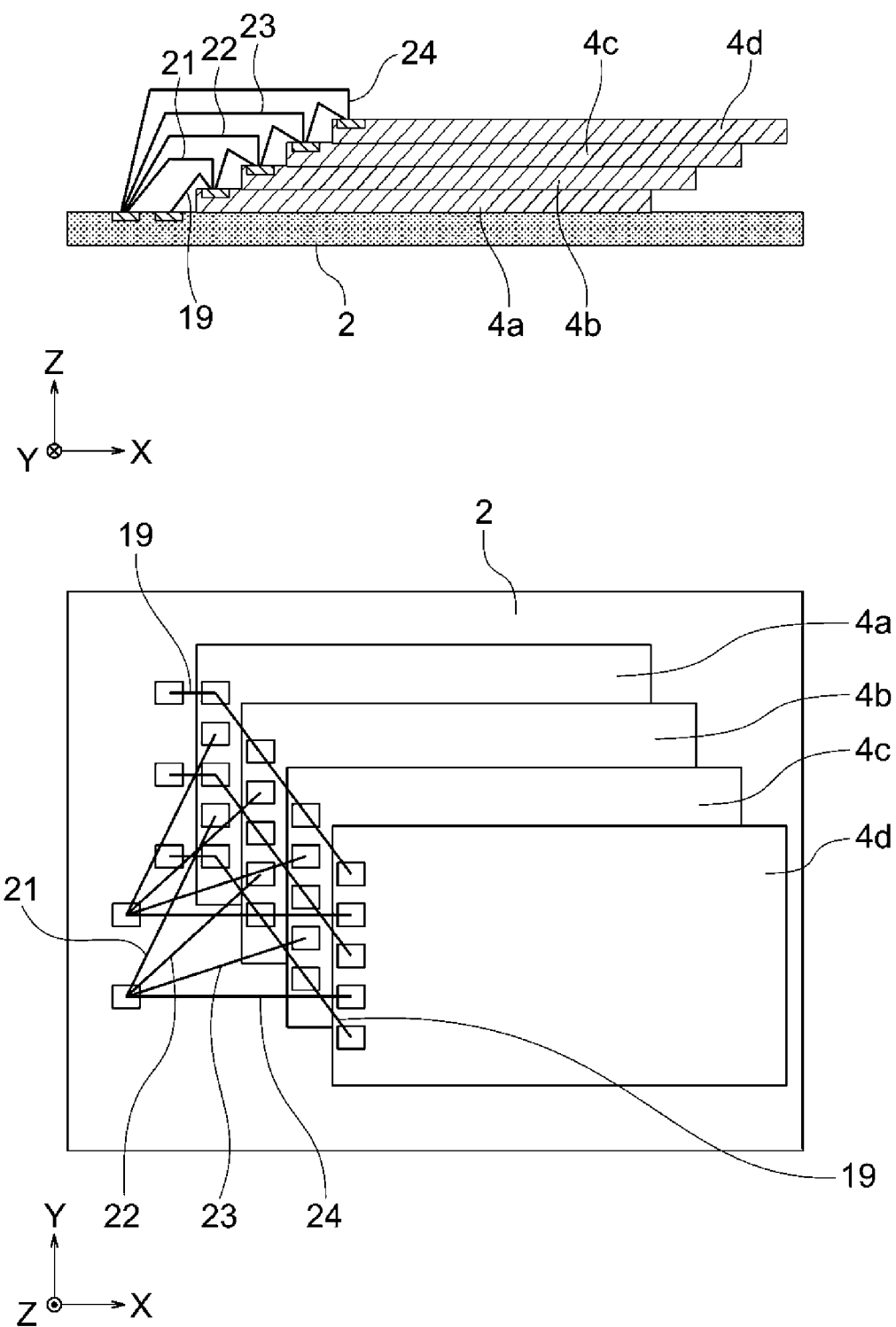

Next, as shown in FIG. 5, a plurality of wires 19 are formed. Next, as shown in FIG. 6, the wires 21 are formed. Next, as shown in FIG. 7, the wires 22 are formed. Next, as shown in FIG. 8, the wires 23 are formed. Next, as shown in FIG. 9, the wires 24 are formed.

As shown in FIGS. 5 to 9, the wires 21 to 24 are formed in order from the wire having the lowest loop height so that the wires 21 to 24 can be more easily formed.

As described above, according to the first embodiment, the variation in the signal transmission characteristics (transmission delay) of each of the wires 21 to 24 is less than or equal to a predetermined value. As a result, deterioration of signal quality can be prevented. As a result, the semiconductor controller chip 3 can receive the signal more appropriately.

Next, as a comparative example, a case where the wires 21 to 24 are connected stage-by-stage like the plurality of wires 19 will be described.

Figure 10:
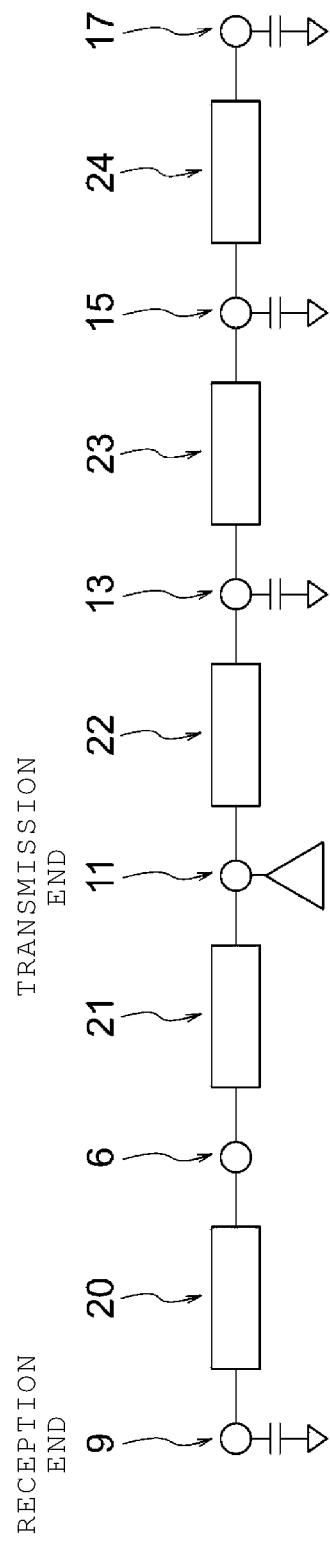
FIG. 10 is a schematic diagram showing an example of a connection relationship between a semiconductor controller chip and a semiconductor memory chip according to a comparative example.

FIG. 10 is a schematic diagram showing an example of the connection relationship between the semiconductor controller chip 3 and the semiconductor memory chips 4a to 4d according to a comparative example. FIG. 10 shows an example in which the semiconductor memory chip 4a transmits a signal and the semiconductor controller chip 3 receives the signal. Therefore, the electrode pad 11 of the semiconductor memory chip 4a is the transmission end, and the electrode pad 9 of the semiconductor controller chip 3 is the reception end.

The signal transmitted from the electrode pad 11 is transmitted to the electrode pad 6 side and the electrode pad 13 side. The signal is reflected by the electrode pad 17 (semiconductor memory chip 4d). Due to this reflection, the waveform quality of the synthesized signal waveform is deteriorated. Further, at least a part of the signal is also reflected by, for example, the electrode pads 13 and 15 (semiconductor memory chips 4b and 4c). This reflection also deteriorates the waveform quality of the waveform of the synthesized signal. Further, the higher the speed of the signal, the more likely the waveform quality is deteriorated.

On the other hand, in the first embodiment, as shown in FIG. 3, each of the electrode pads 9, 11, 13, 15, and 17 of the semiconductor controller chip 3 and the semiconductor memory chips 4a to 4d is directly connected to the electrode pad 6. By making the transmission delays in each of the semiconductor chips substantially the same by centering on the electrode pad 6, it is possible to reduce the deterioration of the waveform quality due to the reflection of the signal. Therefore, it is possible to improve the waveform quality of the waveform received by the semiconductor controller chip 3.

In some cases, signal transmission characteristics may be more affected by the transmission wire than the electrode pad to which the wires are attached. In this case, the variation in the signal transmission characteristics of the plurality of wires 21 to 24 and the wires 20 may be less than or equal to a predetermined value (for example, 10% with respect to the average value).

Further, the semiconductor controller chip 3 is not limited to a controller-type chip but may be another type of semiconductor chip. The semiconductor memory chips 4a to 4d are not limited to the memory-type chips but may be other types of semiconductor chips.

Further, the number of semiconductor memory chips 4a to 4d is not limited to four. The number of wires (wire group) and electrode pads is also not limited to the examples shown in FIGS. 1 and 2.

Modification of First Embodiment

Figure 11:
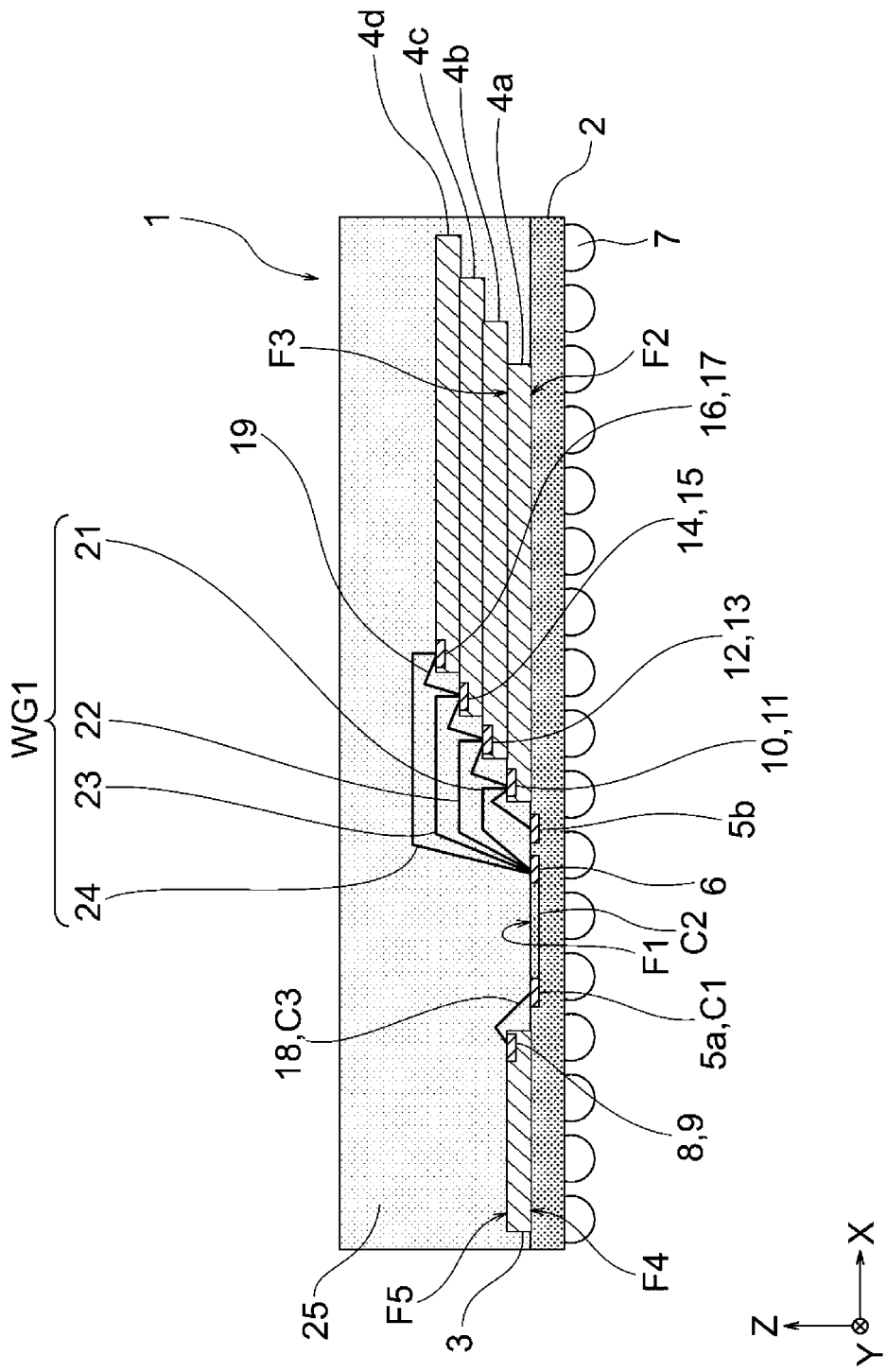
FIG. 11 is a cross-sectional view showing an example of the configuration of a semiconductor device according to a modification of a first embodiment.
Figure 12:
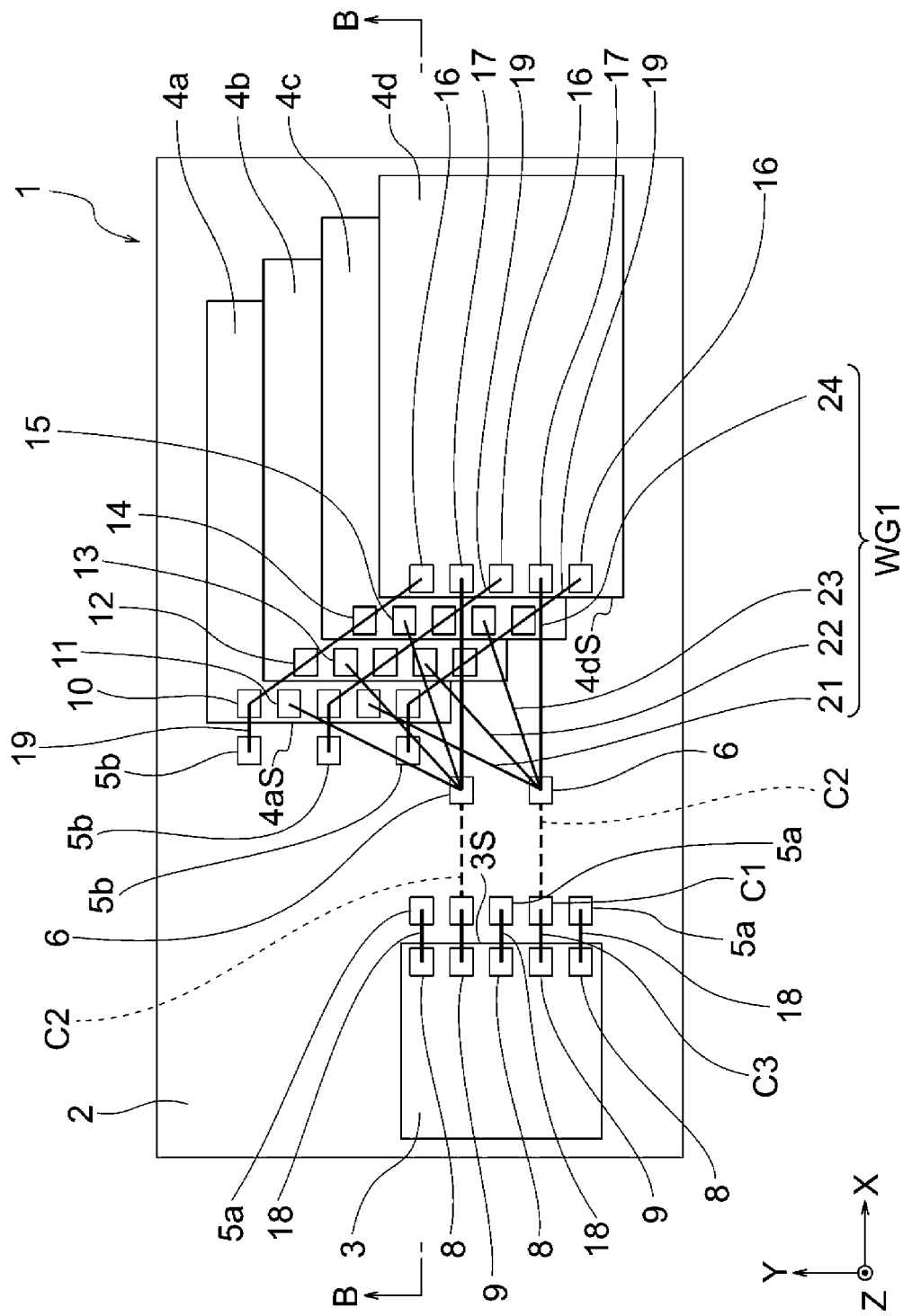
FIG. 12 is a plan view showing an example of the configuration of a semiconductor device according to a modification of a first embodiment.

FIG. 11 is a cross-sectional view showing an example of the configuration of the semiconductor device 1 according to the modification of the first embodiment. FIG. 12 is a plan view showing an example of the configuration of the semiconductor device 1 according to the modification of the first embodiment. The modification of the first embodiment has a different configuration of the connecting conductor C as compared with the first embodiment.

The connecting conductor C in the modification includes an electrode pad C1, a wiring C2, and a wire C3. In this modification of the first embodiment, the wire 20 is not provided.

The electrode pad C1 is, for example, an electrode pad for signal transmission. The electrode pad C1 is provided on the surface F1 of the wiring substrate 2.

The wiring C2 is, for example, wiring for signal transmission. The wiring C2 is provided on or in the wiring substrate 2 and electrically connects the electrode pad 6 of the wiring substrate 2 to the electrode pad C1 of the wiring substrate 2. The wiring C2 may include a columnar electrode (via) element or the like inside the wiring substrate 2.

The wire C3 is, for example, a wire for signal transmission. The wire C3 electrically connects the electrode pad 9 of the semiconductor controller chip 3 and the electrode pad C1 of the wiring substrate 2.

Regardless of the configuration of the connecting conductor C, the signal transmission characteristics (transmission delay) can be adjusted as in the first embodiment. That is, the electrode pads 11, 13, 15, and 17, the electrode pads 9, the wire group WG1 (wires 21 to 24), the electrode pads C1, the wirings C2, and the wires C3 are provided such that the signal transmission characteristics from the electrode pads 6 to each of the semiconductor memory chips 4a to 4d and the signal transmission characteristics from the electrode pad 6 to the semiconductor controller chip 3 are substantially the same.

Since the other configurations of the semiconductor device 1 according to the modification of the first embodiment are the same as the corresponding configurations of the semiconductor device 1 according to the first embodiment, the additional description thereof will be omitted.

The configuration of the connecting conductor C may be changed as in the modification of the first embodiment. The semiconductor device 1 according to the modification of the first embodiment can obtain the same effect as that of the first embodiment.

Second Embodiment

Figure 13:
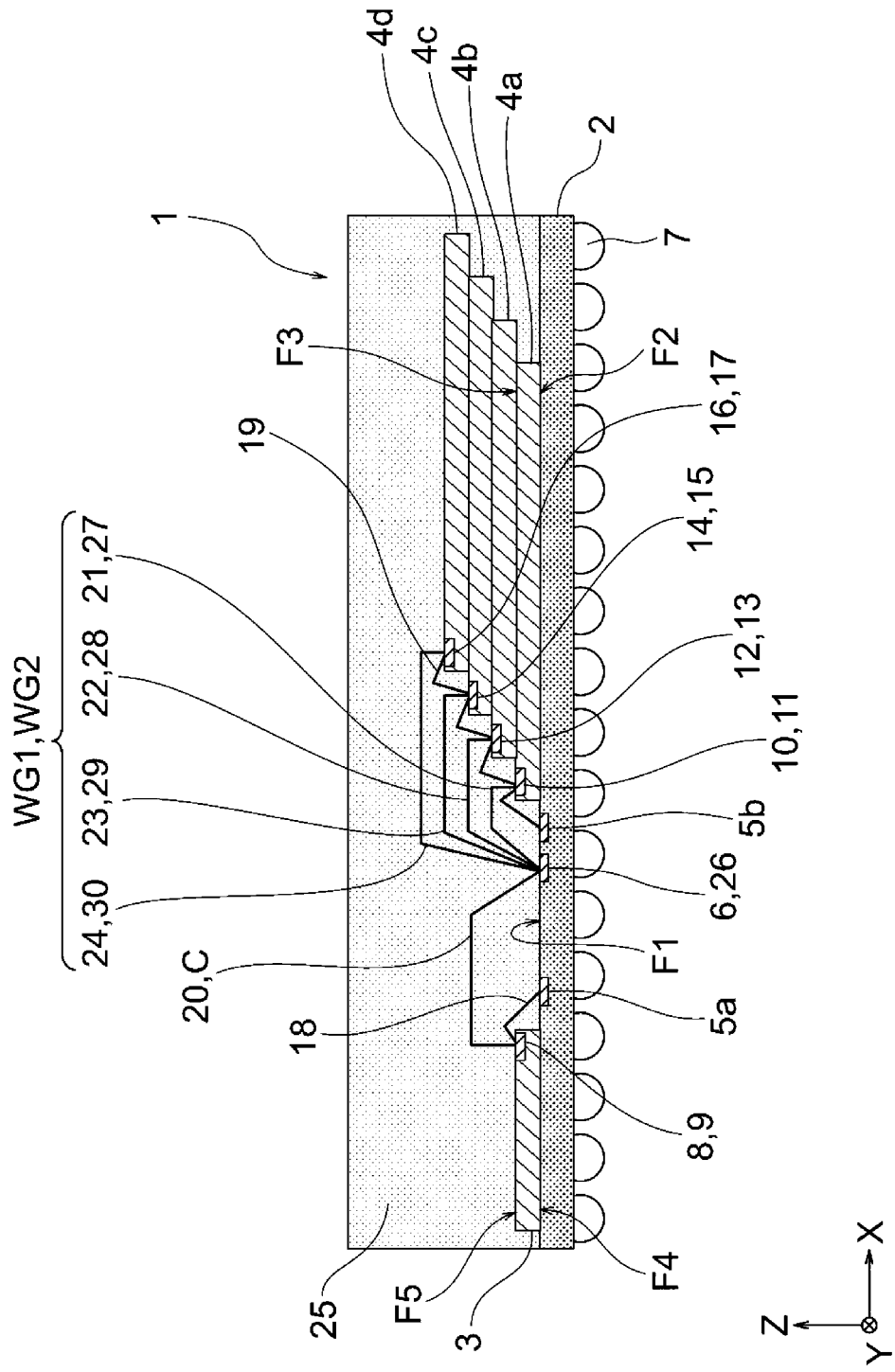
FIG. 13 is a cross-sectional view showing an example of the configuration of a semiconductor device according to a second embodiment.
Figure 14:
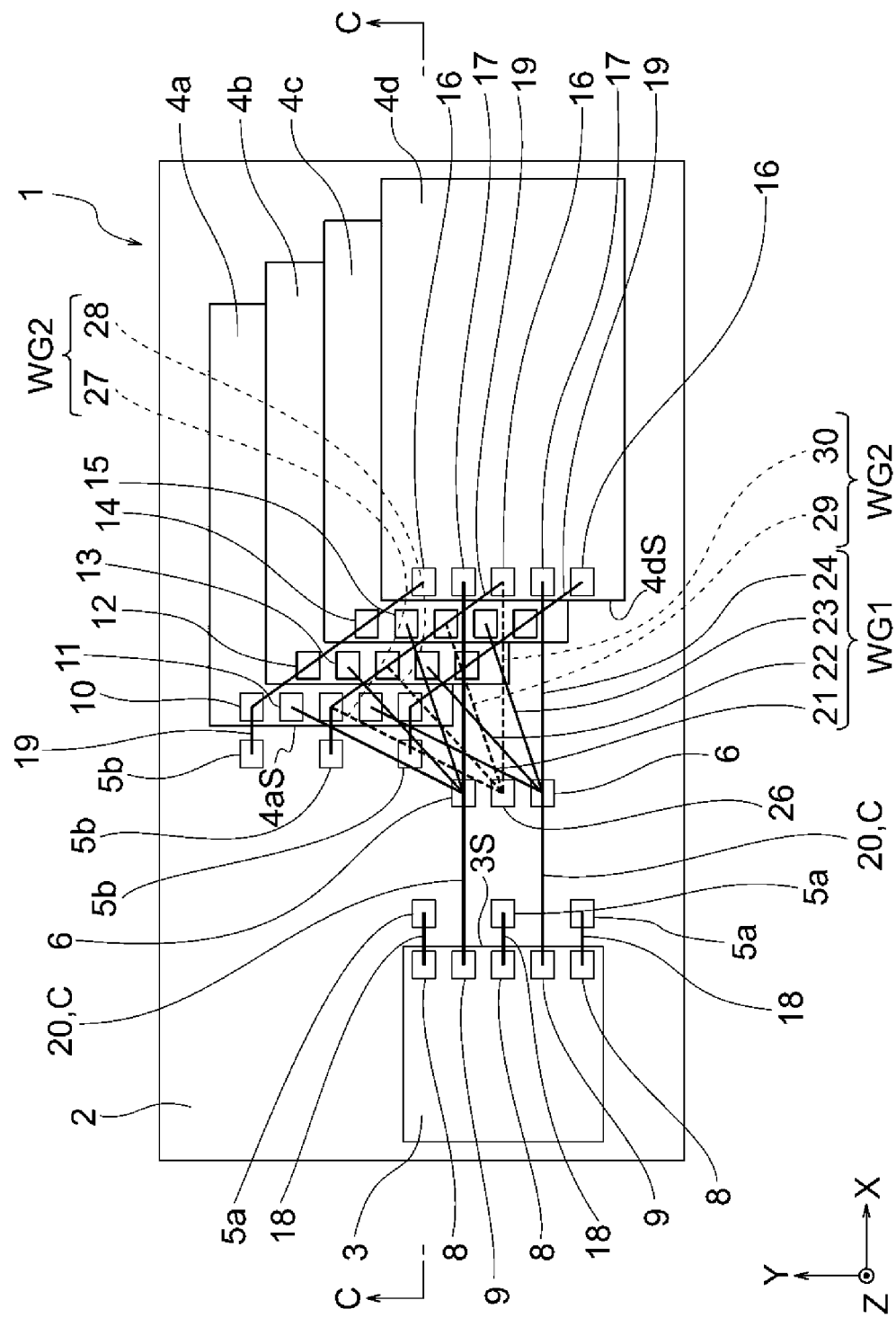
FIG. 14 is a plan view showing an example of the configuration of a semiconductor device according to a second embodiment.

FIG. 13 is a cross-sectional view showing an example of the configuration of the semiconductor device 1 according to the second embodiment. FIG. 14 is a plan view showing an example of the configuration of the semiconductor device 1 according to the second embodiment. Line C-C of FIG. 14 shows a cross section position corresponding to FIG. 13.

The second embodiment is different from the first embodiment in that wires 27 to 30 are additional provided.

The wiring substrate 2 has a plurality of electrode pads 6. In the example shown in FIG. 14, the wiring substrate 2 has two electrode pads 6.

The wiring substrate 2 further has an electrode pad 26 located between the adjacent electrode pads 6. The electrode pad 26 is, for example, an electrode pad for supplying power for power supply or ground.

The semiconductor memory chip 4a has a plurality of electrode pads 11. In the example shown in FIG. 14, the semiconductor memory chip 4a has two electrode pads 11. The adjacent electrode pads 11 sandwich the electrode pads 10 therebetween.

The semiconductor memory chip 4b has a plurality of electrode pads 13. In the example shown in FIG. 14, the semiconductor memory chip 4b has two electrode pads 13. The adjacent electrode pads 13 sandwich the electrode pads 12 therebetween.

The semiconductor memory chip 4c has a plurality of electrode pads 15. In the example shown in FIG. 14, the semiconductor memory chip 4c has two electrode pads 15. The adjacent electrode pads 15 sandwich the electrode pads 14 therebetween.

The semiconductor memory chip 4d has a plurality of electrode pads 17. In the example shown in FIG. 14, the semiconductor memory chip 4d has two electrode pads 17. The adjacent electrode pads 17 sandwich the electrode pads 16 therebetween.

Thus, the semiconductor device 1 in the second embodiment includes a plurality of electrode pads 6, a plurality of electrode pads 11, a plurality of electrode pads 13, a plurality of electrode pads 15, and a plurality of wire groups WG1 corresponding to a plurality of electrode pads 17. In the example shown in FIG. 14, the semiconductor device 1 includes two wire groups WG1.

If two wire groups WG1 are located close to each other, the signal quality may deteriorate due to crosstalk between the wire groups WG1.

Therefore, the semiconductor device 1 further includes a wire group WG2 located between adjacent wire groups WG1.

The wire group WG2 includes wires 27 to 30.

The wire 27 is, for example, a wire for supplying a reference voltage for power supply or ground. The wire 27 electrically connects the electrode pad 26 of the wiring substrate 2 and the electrode pad 10 of the semiconductor memory chip 4a. The electrode pad 10 to be connected to the wire 27 is located between the adjacent electrode pads 11 as described above.

The wire 27 connected to the semiconductor memory chip 4a is located between two wires 21 connected to the semiconductor memory chip 4a provided in each of the adjacent wire groups WG1. As shown in FIG. 13, the wire 27 has substantially the same loop shape as the wire 21 when viewed from the Y direction.

The wire 28 is, for example, a wire for supplying a reference voltage for power supply or ground. The wire 28 electrically connects the electrode pad 26 of the wiring substrate 2 and the electrode pad 12 of the semiconductor memory chip 4b. The electrode pad 12 to be connected to the wires 28 is located between the adjacent electrode pads 13 as described above.

The wire 28 connected to the semiconductor memory chip 4b is located between the two wires 22 connected to the semiconductor memory chip 4b provided in each of the adjacent wire groups WG1. As shown in FIG. 13, the wire 28 has substantially the same loop shape as the wire 22 when viewed from the Y direction.

The wire 29 is, for example, a wire for supplying a reference voltage for power supply or ground. The wire 29 electrically connects the electrode pad 26 of the wiring substrate 2 and the electrode pad 14 of the semiconductor memory chip 4c. The electrode pad 14 to be connected to the wire 29 is located between the adjacent electrode pads 15 as described above.

The wire 29 connected to the semiconductor memory chip 4c is located between two wires 23 connected to the semiconductor memory chip 4c provided in each of the adjacent wire groups WG1. As shown in FIG. 13, the wire 29 has substantially the same loop shape as the wire 23 when viewed from the Y direction.

The wire 30 is, for example, a wire for supplying a reference voltage for power supply or ground. The wire 30 electrically connects the electrode pad 26 of the wiring substrate 2 and the electrode pad 16 of the semiconductor memory chip 4d. The electrode pad 16 to be connected to the wire 30 is located between the adjacent electrode pads 17 as described above.

The wire 30 connected to the semiconductor memory chip 4d is located between two wires 24 connected to the semiconductor memory chip 4d provided in each of the adjacent wire groups WG1. As shown in FIG. 13, the wire 30 has substantially the same loop shape as the wire 24 when viewed from the Y direction.

Wires 27 to 30 (wire group WG2) can reduce the crosstalk between adjacent wire groups WG1. As a result, deterioration of signal quality can be prevented.

Since the other configurations of the semiconductor device 1 according to the second embodiment are the same as the corresponding configurations of the semiconductor device 1 according to the first embodiment, the additional description thereof will be omitted.

The wires 27 to 30 may be provided as in the second embodiment. The semiconductor device 1 according to the second embodiment can obtain the same effect as that of the first embodiment. Further, the second embodiment may be combined with the modification of the first embodiment.

Third Embodiment

Figure 15:
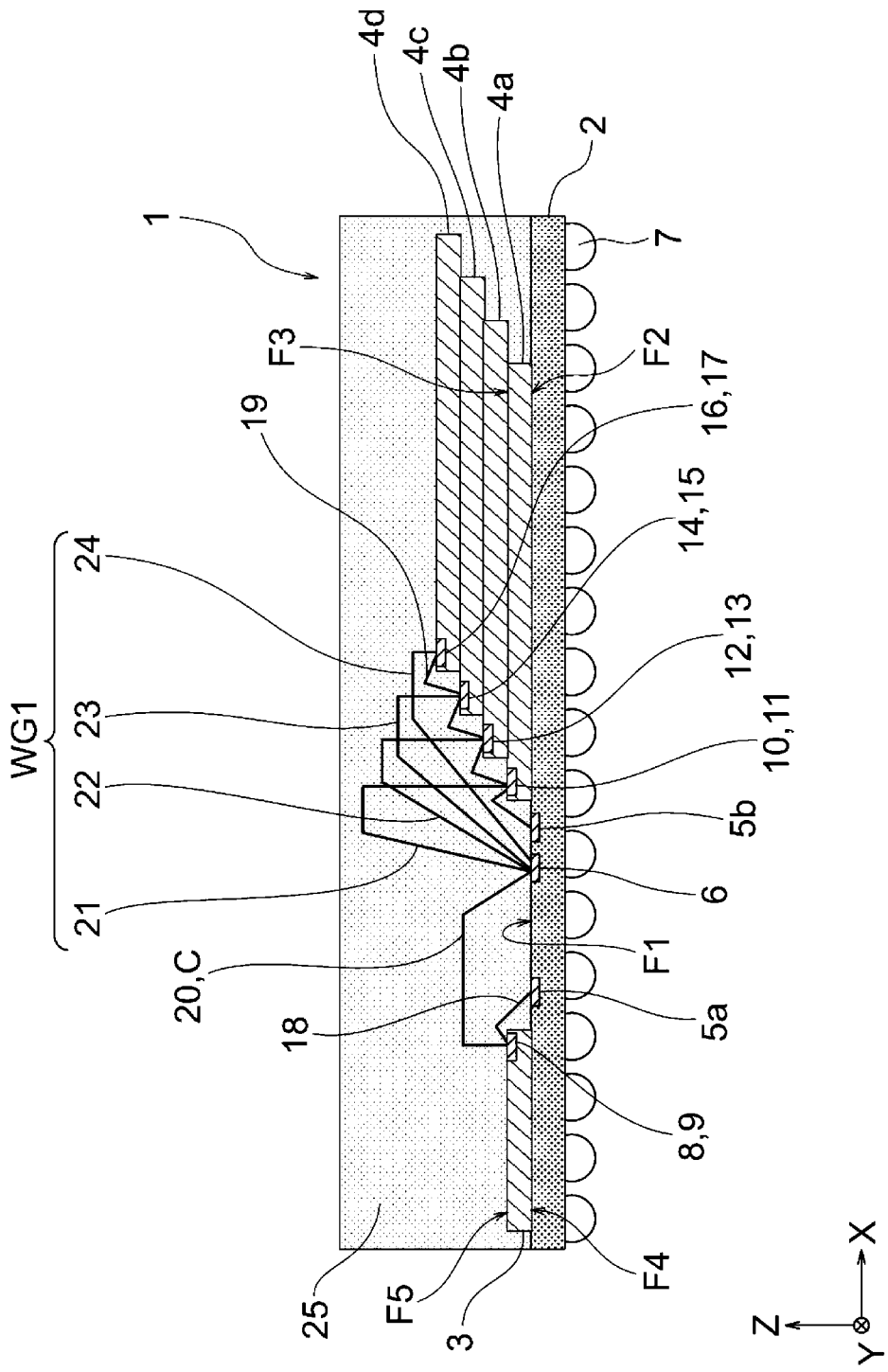
FIG. 15 is a cross-sectional view showing an example of the configuration of a semiconductor device according to a third embodiment.
Figure 16:
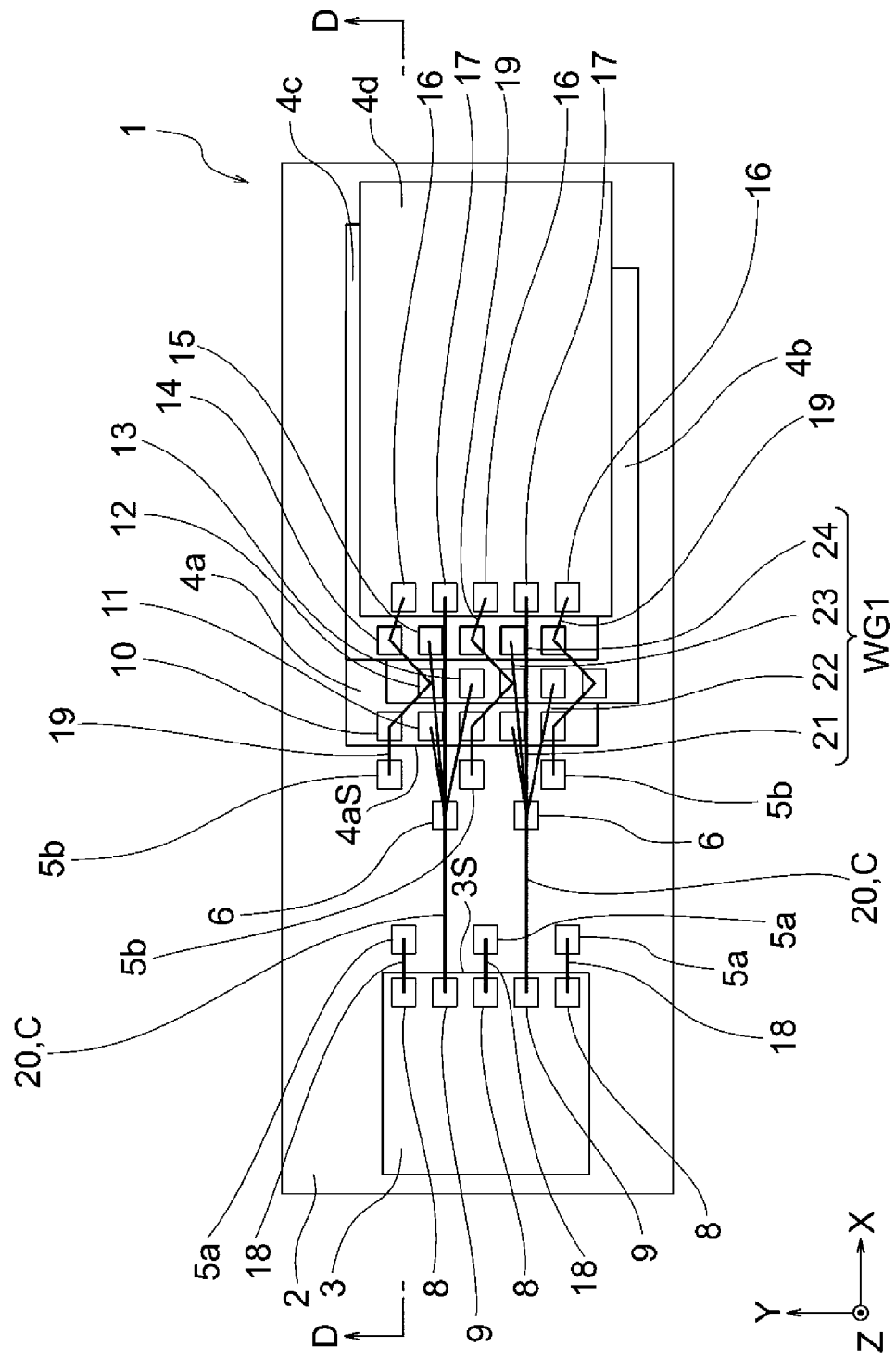
FIG. 16 is a plan view showing an example of the configuration of a semiconductor device according to a third embodiment.

FIG. 15 is a cross-sectional view showing an example of the configuration of the semiconductor device 1 according to the third embodiment. FIG. 16 is a plan view showing an example of the configuration of the semiconductor device 1 according to the third embodiment. Line D-D of FIG. 16 shows a cross section position corresponding to FIG. 15.

The third embodiment is different from the first embodiment in the stacked structure of the semiconductor memory chips 4a to 4d.

In the example shown in FIG. 16, the stacked structures of the semiconductor memory chips 4a to 4d are alternately displaced (offset) with respect to the Y direction. That is, the semiconductor memory chip 4b is stacked offset from the semiconductor memory chip 4a in the −Y direction. The semiconductor memory chip 4c is stacked offset from the semiconductor memory chip 4b in the +Y direction. The semiconductor memory chip 4d is stacked offset from the semiconductor memory chip 4c in the −Y direction.

That is, adjacent semiconductor memory chips 4a to 4d are stacked to be alternately staggered in the Y direction opposite to each other along the Z direction. Thereby, the semiconductor memory chips 4a to 4d can be stacked staggered so that the wires 21 to 24 do not intersect in the plan view. Further, as compared with the first embodiment described with reference to FIG. 2, the required arrangement area for the semiconductor memory chips 4a to 4d can be reduced in the Y direction.

The amount of deviation of the semiconductor memory chips 4a to 4d in the Y direction may be changed within a range in which the wires 21 to 24 do not overlap in a plan view.

As shown in FIG. 15, the heights of the loops of the wires 21 to 24 may differ depending on the distance between the electrode pads 6 and the electrode pads 11, 13, 15, and 17. For example, the wire 21 connected to the semiconductor memory chip 4a closest to the electrode pad 6 has the highest loop. The wire 24 connected to the semiconductor memory chip 4d farthest from the electrode pad 6 has the lowest loop. That is, the maximum height of the loop of the wire 24 connected to the electrode pad 17 of the semiconductor memory chip 4d farthest from the wiring substrate 2 is lower than the maximum height of the loop of the wire 21 connected to the electrode pad 11 of the semiconductor memory chip 4a closest to the wiring substrate 2.

As described above, in the second embodiment, by adjusting the height of the loop, the lengths of the wires 21 to 24 are adjusted to be substantially the same.

Since the other configurations of the semiconductor device 1 according to the third embodiment are the same as the corresponding configurations of the semiconductor device 1 according to the first embodiment, additional description thereof will be omitted.

Next, a method of connecting the wires 19 and 21 to 24 to be connected to the semiconductor memory chips 4a to 4d according to the third embodiment will be described.

FIGS. 17 to 22 are diagrams showing an example of the manufacturing method of the semiconductor device 1 according to the third embodiment. The upper part of FIGS. 17 to 22 are cross-sectional views of the semiconductor memory chips 4a to 4d. The lower part of FIGS. 17 to 22 are plan views of the semiconductor memory chips 4a to 4d.

As shown in FIG. 17, the semiconductor memory chips 4a to 4d are first mounted on the wiring substrate 2. The semiconductor memory chips 4a to 4d are stacked to be displaced in the X direction and the Y direction.

Next, as shown in FIG. 18, a plurality of wires 19 are formed. Next, as shown in FIG. 19, the wire 24 is formed. Next, as shown in FIG. 20, the wire 23 is formed. Next, as shown in FIG. 21, the wire 22 is formed. Next, as shown in FIG. 22, the wire 21 is formed.

As shown in FIGS. 17 to 22, the wires 21 to 24 are formed in order from the wire having the lowest loop height so that the wires 21 to 24 can be more easily formed.

As in the third embodiment, the stacked structure of the semiconductor memory chips 4a to 4d may be changed in the range in which the wires 19, 21 to 24 can be connected. The semiconductor device 1 according to the third embodiment can obtain the same effect as that of the first embodiment. Further, a modification of the first embodiment may be combined with the third embodiment.

Fourth Embodiment

Figure 23:
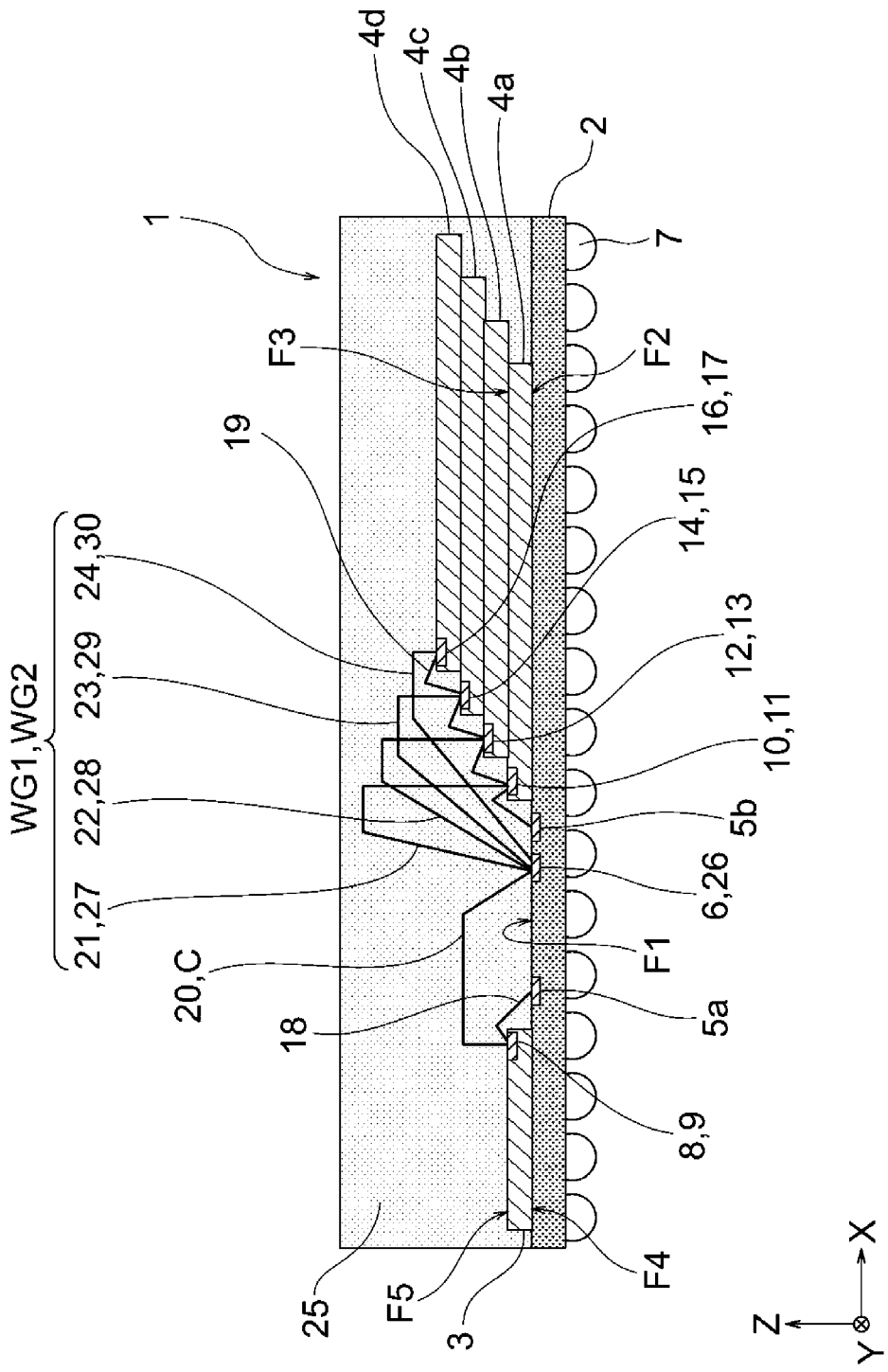
FIG. 23 is a cross-sectional view showing an example of the configuration of a semiconductor device according to a fourth embodiment.
Figure 24:
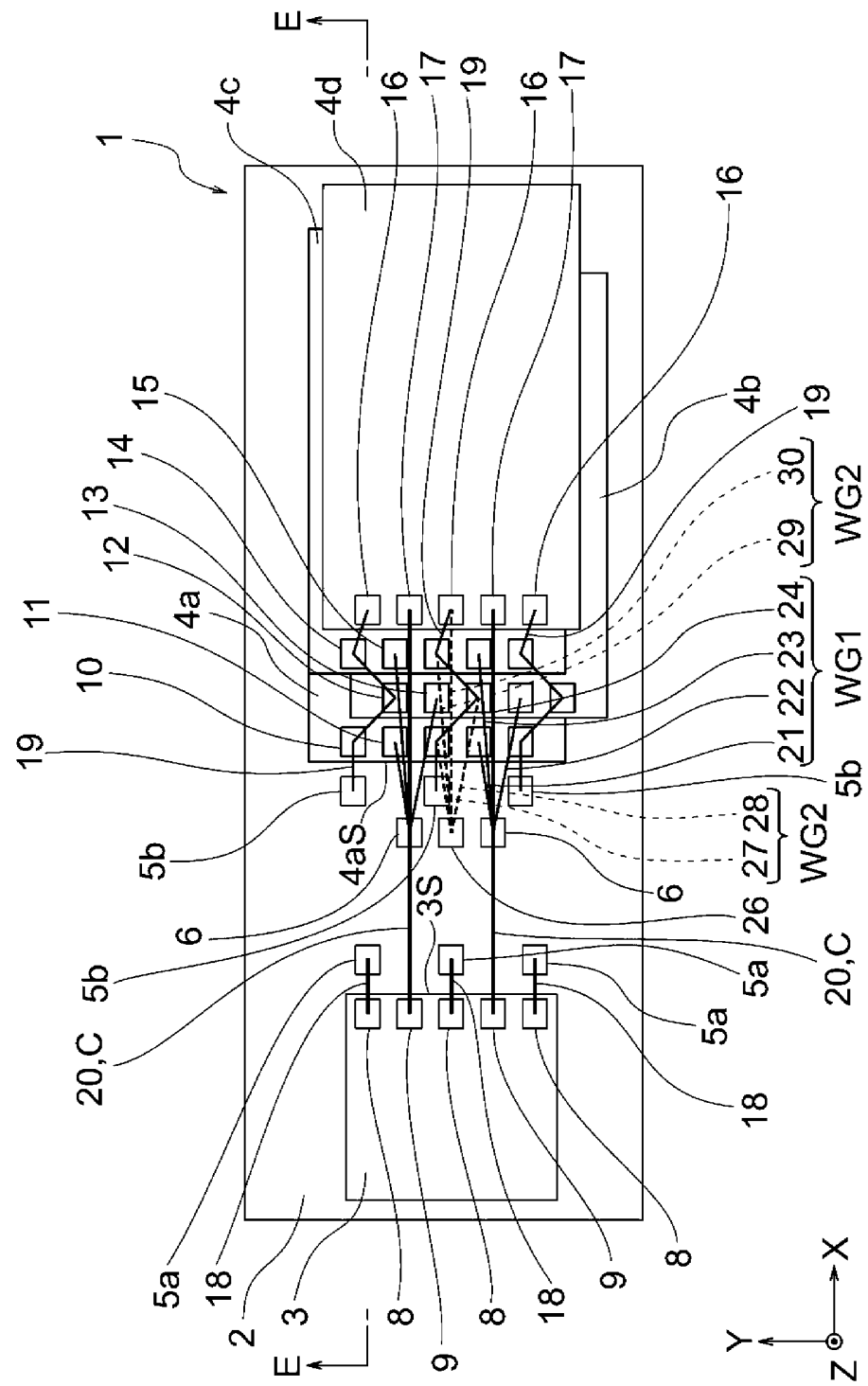
FIG. 24 is a plan view showing an example of the configuration of a semiconductor device according to a fourth embodiment.

FIG. 23 is a cross-sectional view showing an example of the configuration of the semiconductor device 1 according to the fourth embodiment. FIG. 24 is a plan view showing an example of the configuration of the semiconductor device 1 according to the fourth embodiment. Line E-E of FIG. 24 shows a cross section position corresponding to FIG. 23.

The fourth embodiment is different from the third embodiment in that wires 27 to 30 are additionally provided. The fourth embodiment may be considered a combination of the second embodiment and the third embodiment.

As described in the second embodiment, the wires 27 to 30 (wire group WG2) can reduce crosstalk between adjacent wire groups WG1. As a result, deterioration of signal quality can be reduced.

The semiconductor device 1 according to the fourth embodiment can obtain the same effect as that of the third embodiment. Further, a modification of the first embodiment may be combined with the fourth embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a substrate having a first surface, a first pad, and a second pad, the first and second pads being on the first surface;
    a chip stack of a plurality of first semiconductor chips, each having a third pad and a fourth pad on a surface facing away from the first surface;
    a first wire group including a plurality of first wires, each first wire electrically connecting the first pad to a third pad of one of the first semiconductor chips;
    a second wire electrically connecting the second pad to and the fourth pad of the one of the first semiconductor chips closest to the substrate; and
    a third wire electrically connecting each fourth pad of the plurality of first semiconductor chips.

2. The semiconductor device according to claim 1, wherein the maximum height of a loop of the first wire connected to the third pad of the first semiconductor chip farthest from the substrate is lower than the maximum height of a loop of the first wire connected to the third pad of the first semiconductor chip closest to the substrate.

3. The semiconductor device according to claim 1, further comprising:
    a fifth pad on the first surface of the substrate;
    a sixth pad on the surface of each of the first semiconductor chips;
    a fourth wire electrically connecting the fifth pad and the sixth pad of the first semiconductor chip closest to the substrate; and
    a fifth wire electrically connecting each sixth pad of the plurality of first semiconductor chips.

4. The semiconductor device according to claim 3, wherein the fourth pad, the third pad, and the sixth pad on each of the first semiconductor chips are arranged in this respective order along one direction perpendicular to a stacking direction of the chip stack.

5. The semiconductor device according to claim 3, wherein
    the fourth pads are pads to which one of a power supply voltage or a ground voltage is applied,
    the sixth pads are pads to which the other of the power supply voltage and the ground voltage is applied, and
    the third pads are pads to which a signal is input.

6. The semiconductor device according to claim 1, wherein the thickness of each of the first wires is within 10% of the average value of the thicknesses of the plurality of first wires.

7. The semiconductor device according to claim 6, wherein the length of each of the first wires is within 10% of the average value of the length of the plurality of first wires.

8. The semiconductor device according to claim 1, further comprising:
    a second semiconductor chip on the first surface;
    a seventh pad on a surface of the second semiconductor chip facing away from the first surface; and
    a connecting conductor electrically connecting the first pad and the seventh pad.

9. The semiconductor device according to claim 8, wherein the connecting conductor is a bonding wire spanning from the seventh pad to the first pad.

10. The semiconductor device according to claim 9, further comprising:

an eighth pad on the first surface at position between the second semiconductor chip and the first pad, wherein the connecting conductor comprises:
- a substrate wiring portion in the substrate and electrically connecting the first pad to the eighth pad, and
- a bonding wire portion electrically connecting the eighth pad to the seventh pad.

11. The semiconductor device according to claim 1, wherein
the third pads are each on a first side portion of the surface of the first semiconductor chips, and
the first semiconductor chips are each offset from one another in a first direction such that the first side portion of the surface of each first semiconductor chip is left uncovered by the other first semiconductor chips in the chip stack.

12. The semiconductor device according to claim 11, wherein first semiconductor chips are also each offset from one another in a second direction intersecting the first direction.

13. The semiconductor device according to claim 11, wherein adjacent first semiconductor chips in the chip stack are offset in alternating directions along a second direction intersecting the first direction.

* * * * *